(12) United States Patent
Huang et al.

(10) Patent No.: US 8,532,215 B2
(45) Date of Patent: Sep. 10, 2013

(54) MULTI-CARRIER AMPLIFIER LINEARIZATION SYSTEM AND METHOD

(75) Inventors: Xinping Huang, Ottawa (CA); Zhiwen Zhu, Kanata (CA); Mario Caron, Gatineau (CA)

(73) Assignee: Her Majesty the Queen in Right of Canada, as Represented by the Minister of Industry, through the Communications Research Centre Canada, Ottawa (CA)

( * ) Notice: Subject to any disclaimer, the term of this patent is extended or adjusted under 35 U.S.C. 154(b) by 450 days.

(21) Appl. No.: 12/880,590

(22) Filed: Sep. 13, 2010

(65) Prior Publication Data

US 2011/0064171 A1 Mar. 17, 2011

Related U.S. Application Data

(60) Provisional application No. 61/242,060, filed on Sep. 14, 2009.

(51) Int. Cl.
*H04B 7/02* (2006.01)
*H04L 1/02* (2006.01)

(52) U.S. Cl.
USPC ............................ 375/267; 375/295; 375/297

(58) Field of Classification Search
USPC .................. 375/260, 267, 295, 297
See application file for complete search history.

(56) References Cited

U.S. PATENT DOCUMENTS

| | | | |
|---|---|---|---|
| 5,903,823 A | 5/1999 | Moriyama et al. | 455/126 |
| 6,771,709 B2 | 8/2004 | Huang et al. | 375/296 |
| 6,885,241 B2 | 4/2005 | Huang et al. | 330/149 |
| 7,471,736 B2 | 12/2008 | Ding et al. | 375/296 |
| 2003/0179829 A1 * | 9/2003 | Pinckley et al. | 375/295 |
| 2004/0082300 A1 | 4/2004 | Scheck | 455/126 |
| 2006/0012427 A1 * | 1/2006 | Nezami | 330/149 |
| 2007/0063769 A1 * | 3/2007 | Jelonnek | 330/149 |
| 2007/0069813 A1 | 3/2007 | Li et al. | 330/149 |
| 2007/0216480 A1 * | 9/2007 | Benedict | 330/149 |
| 2008/0095266 A1 * | 4/2008 | Rashev et al. | 375/298 |
| 2008/0143562 A1 * | 6/2008 | Huang et al. | 341/118 |
| 2009/0141828 A1 | 6/2009 | Huang et al. | 375/296 |

FOREIGN PATENT DOCUMENTS

WO 2008/006069 1/2008

OTHER PUBLICATIONS

G.Prescott, J.Hammond, and D.Hertling, "Adaptive estimation of transmission distortion in a digital communications channel", *IEEE Trans. on Communications*, vol. 36, No. 9, Sep. 1988.

T.Muller, "Performance degradation in GPS-receivers caused by group delay variations of SAW-filters", *IEEE MTT-S Digest*, Jun. 7-12, 1998.

(Continued)

*Primary Examiner* — Chieh M Fan
*Assistant Examiner* — Freshteh N Aghdam
(74) *Attorney, Agent, or Firm* — Teitelbaum & MacLean; Neil Teitelbaum; Doug MacLean

(57) ABSTRACT

The invention relates to a method and circuit for linearizing amplifiers and other nonlinear circuits for multi-carrier signals. An output signal from the amplifier is sampled, and a correlation matrix of size N×N is computed from the sampled signal, wherein N exceeds the number of multiplexed carriers in the signal. A signal-to-distortion ratio (SDR) is then estimated based on a ratio of one or more largest to one or more smallest eigenvalues of the correlation matrix, and the signal into the amplifier is pre-distorted so as to maximize the SDR.

19 Claims, 21 Drawing Sheets

(56) References Cited

OTHER PUBLICATIONS

F.Perez-Martinez, M.Burgos-Garcia and A.Asensio-Lopez, "Group delay effects on the performance of wideband CW-LFM radars", *IEE Proc.-Radar, Sonar Navig.*, vol. 148, No. 2, Apr. 2001.

X.Huang and M.Caron, "A novel adaptive type-based baseband predistorter for solid-state power amplifier", *Proceedings of AIAA ICSSC2002*, Montreal, Canada, May 13-15, 2002.

H.Durney and J.Sala, "CDF estimation for pre-distortion of non-linear high power amplifiers", *Proceedings of ICASSP2002*, May 13-17, 2002.

X. Huang and M. Caron, "Experimental Results of a Type-Based Predistorter for SSPA Linearization", *Proceedings of ISCAS2004*, Vancouver, Canada, May 23-26, 2004.

X. Huang and M. Caron, "Performance of a Type-Based Digital Predistorter for Solid-State Power Amplifier Linearization", *Proceedings of ISCAS2005*, Kobe, Japan, May 23-26, 2005.

D.Huang, X.Huang and H.Leung, "Nonlinear Compensation of High Power Amplifier Distortion for Communication Using a Histogram-based Method", *IEEE Trans. on Signal Processing*, vol. 54, Nov. 2006.

X.Huang and M.Caron, "Benefit of linearizing power amplifiers in multi-port amplifier subsystems", *Proceedings of ISCAS2008*, Seattle, USA, May 18-21, 2008.

X.Huang and M.Caron, "Performance improvement from linearizing power amplifiers in multi-port amplifier subsystems", *Signal Processing for Space Communications*, Rhodes, Greece, Oct. 6-8, 2008.

M.Caron and X.Huang, "Estimation of gain and phase mismatch between amplifiers in a multiple port amplifier subsystem", *ESA Workshop on Advanced Flexible Telecom Payloads*, Noordwijk, Netherlands, Nov. 18-20, 2008.

X.Huang and M.Caron, "A novel type-based vector modulator self-calibration technique", to be presented at *ISCAS2009*, Taipei, Taiwan, May 24-27, 2009.

"The cube coefficient subspace architecture for nonlinear digital predistortion" Herman et al. $42^{nd}$ Asilomar Conference on Signal, Systems and Computers, Oct. 26, 2008, pp. 1857-1861.

* cited by examiner

US 8,532,215 B2

MULTI-CARRIER AMPLIFIER LINEARIZATION SYSTEM AND METHOD

CROSS-REFERENCE TO RELATED APPLICATIONS

The present invention claims priority from U.S. Provisional Patent Application No. 61/242,060 filed Sep. 14, 2009, entitled "Estimation of nonlinearity in a transmit chain of multi-carrier transmission system", which is incorporated herein by reference.

TECHNICAL FIELD

The present invention relates generally to multi-frequency communication systems with transmission non-linearities, and more particularly relates to a method and circuit for pre-compensation of non-linear distortions experienced by a frequency-multiplexed signal in such systems.

BACKGROUND OF THE INVENTION

Many communication systems have elements or subs-systems that introduce undesirable nonlinear distortions into signals they transmit. For example, radio signal transmitters of wireless communication systems typically include power amplifiers (PA) at the output thereof, which often have non-linear input-output characteristics, and therefore introduce non-linear distortions into the output wireless signal. Linearization of a PA has been a challenging problem, especially for multi-carrier communication systems. A key issue in such linearization is to characterize the nonlinear-distortion of the multi-carrier signal caused by the PA nonlinearity. Once the effect of the PA nonlinearity on the signal is suitably characterized, the signal entering the PA can be pre-distorted in such a way that pre-compensates for the PA nonlinearity, reducing the nonlinear distortion of the output signal to a suitably low level.

U.S. Pat. No. 6,885,241, which has common inventors with the present application and is assigned to the assignee of the present application, discloses a type-based approach to generating a based-band pre-distortion function for pre-compensating single-frequency signals prior to entering the PA. Although the method disclosed in the U.S. Pat. No. 6,885,241 can be configured for use with multi-frequency signals wherein the number of multiplexed frequency channels is small, it does not provide a good estimation of the required phase compensation when the signal contain a large number of asynchronous multiplexed carriers.

An object of the present invention is to provide a method and circuit for compensating for nonlinear distortions of frequency-multiplexed signals in multi-carrier communication systems.

SUMMARY OF THE INVENTION

Accordingly, the present invention relates to a method for compensating for nonlinear distortion of a frequency-multiplexed (FM) signal in an amplifier, which comprises the following steps: a) pre-distorting the FM signal prior to passing thereof through the amplifier in accordance with one or more adjustable pre-distortion parameters; b) passing the FM signal through the amplifier to obtain an output FM signal; c) sampling at least a portion of the output FM signal to obtain a sampled signal comprising a sequence of signal samples; d) computing a signal correlation matrix of size N×N for the sampled signal, wherein N is an integer greater than a number K of frequency channels in the FM signal, wherein K>1; e) estimating a signal to distortion ratio (SDR), or a value related thereto, based on the signal correlation matrix; and, f) iteratively repeating steps a) to e) while varying the one or more adjustable pre-distortion parameters so as to increase the SDR.

According to one aspect of the method, the SDR is estimated based on a ratio of eigenvalues of the correlation matrix. In one embodiment, the method comprises computing a ratio of one or more largest eigenvalues to one or more smallest eigenvalues. In one embodiment, the method comprises computing a ratio of a sum of K largest eigenvalues and a sum of (N−K) smallest eigenvalues. In one embodiment, the step of computing the correlation matrix comprises computing N different autocorrelation coefficients of the sampled signal.

Another aspect of the present invention relates to a circuit comprising an amplifier having an input port for receiving an input frequency-multiplexed (FM) signal comprised of K frequency channels, and an output port for outputting an output FM signal, wherein the amplifier introduces nonlinear distortions into the input FM signal while forming therefrom the output FM signal. The circuit further comprises a pre-distorter coupled to the input port of the nonlinear circuit for pre-distorting the input FM signal in accordance with one or more adjustable pre-distortion parameters prior to passing thereof through the amplifier, a signal sampler coupled to the output port of the amplifier for sampling at least a portion of the output FM signal for obtaining a sampled output signal, and a controller operatively coupled between the signal sampler and the pre-distortion circuit for receiving the sampled output signal and for iteratively generating the one or more adjustable pre-distortion parameters. The controller further comprises a correlation computing module for computing a correlation matrix of size N×N for the sampled output signal, wherein N is an integer greater than K, an SDR computing module operatively coupled to the correlation computing module for computing a signal distortion ratio (SDR) based on the correlation matrix, and a pre-distortion generator operatively coupled to the SDR computing module for generating the one or more pre-distortion parameters in dependence upon the SDR.

BRIEF DESCRIPTION OF THE DRAWINGS

The invention will be described in greater detail with reference to the accompanying drawings which represent preferred embodiments thereof, in which like elements are indicated with like reference numerals, and wherein.

DETAILED DESCRIPTION

Figure 1:
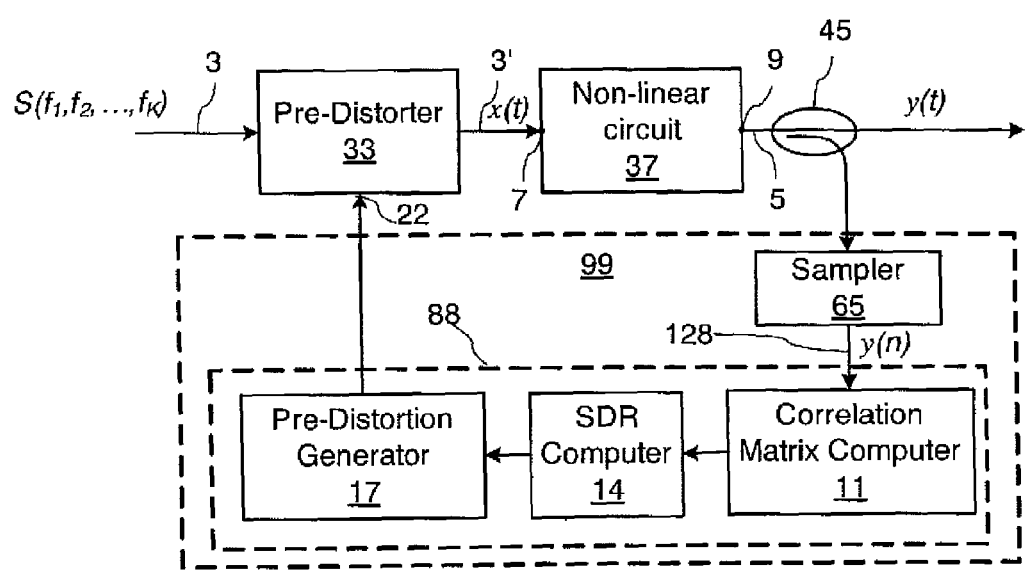
FIG. 1 is a schematic block diagram of a circuit with pre-compensation of non-linear distortions according to the present invention.

In the following detailed description, numerous specific details are set forth in order to provide a thorough understanding of the invention. However it will be understood by those of ordinary skill in the art that the present invention may be practiced without these specific details. In other instances, well-known methods, procedures, components and circuits have not been described in detail so as not to obscure the present invention.

Some portions of the detailed description, which follow, are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Furthermore, the term "circuit" in the context of the present specification means either a single component or a multiplicity of components, either active and/or passive, that are arranged to cooperate with one another to provide a desired function, and may be at least partially implemented in firmware and/or software.

The term "signal" means at least one RF signal, current signal, voltage signal or data signal, and may mean a complex signal such as that composed of quadrature I and Q signals.

The term "modulated signal" as used herein includes modulated AC carrier signals having non-zero carrier frequency and having its frequency, phase and/or amplitude modulated according to a pre-determined modulation format with a sequence of information symbols, and modulating signals having a DC carrier, such as binary or multi-level data signals, used to modulate one of the parameters of an AC carrier signal. The terms "modulation format" and "modulation scheme" are used in the specification interchangeably.

Exemplary embodiments of a circuit for compensating distortions experienced by a multi-carrier signal in a non-linear circuit will now be described in detail with reference to block diagrams shown in FIGS. 1-4, wherein like elements are indicated with like reference numerals. Each block in the diagrams shown in FIGS. 1 to 4 is a functional unit of the circuit, and is adopted to perform one or several steps of the method of the present invention for compensating non-linear distortions of the multi-carrier signal in one embodiment thereof; these steps will be also hereinafter described in conjunction with the description of the corresponding functional blocks of the circuit.

Referring first to FIG. 1, there is shown a simplified block diagram of an apparatus 1 with compensation for non-linear distortions of an input multi-carrier frequency-multiplexed (FM) signal according to an embodiment of the present invention. The apparatus 1, which is also referred to hereinafter as circuit 1, includes a non-linear circuit (NLC) 37 for performing a desired function on the FM signal passing therethrough. The NLC 37 has an input port 7 for receiving the FM signal 3, and an output port 9 for outputting the FM signal after it passed therethrough. In the following, the FM signal prior to entering the NLC 37 is referred to as the input FM signal 3, and after passing the NLC 37 as the output FM signal 5. The NLC 37 is operationally preceded by a pre-distorter (PD) 33, which is coupled to the input port 7 of the NLC 37 for pre-distorting the FM signal 3 so as to pre-compensate for non-linear distortions in the NLC 37, as described in detail hereinbelow. A feedback circuit 99 is coupled between the output port 9 of the NLC 37 and a control port 22 of the pre-distorter 33; its function is to control the operation of the pre-distorter 33 in dependence upon the output FM signal 5 at the output port 9 of the NLC 37. In operation, the feedback circuit 99 receives the output FM signal 5 from the output port 9, or at least a portion thereof that is tapped off from the output port 9 using a tap coupler 45, and estimates the nonlinear distortion that is present in the output FM signal 5 at the output of the NLC 37, so as to enable the pre-distorter 33 to pre-compensate for it. The feedback circuit 99 may operate iteratively, repeatedly adjusting a pre-distortion function applied to the input FM signal 3 by the pre-distorter 33 until the non-linear distortion, as measured by the feedback circuit 99, is sufficiently reduced.

The feedback circuit 99 includes a sampling circuit 65, also referred to hereinafter as sampler 65, which is operatively followed by a controller 88 for controlling the pre-distorter 33. The controller 88 includes several functional blocks such as a correlation computing module 11, which is also referred to hereinafter as a correlation matrix computer (CMC), an SDR computing module 14, which is also referred to hereinafter as SDR computer, and a pre-distortion generator (PDG) 17, wherein the abbreviation 'SDR' stands for "signal-to-distortion ratio". The CMC 11, SDR computer 14 and PDG 17 may be embodied as software or firmware modules define within a single processor or multiple processors, or with dedicated hardware logic.

According to embodiments of the present invention, the controller 88 utilizes a novel technique to estimate the non-linear distortions of a signal in a transmit chain of a multi-carrier communication system. The technique is based on a realization that a multi-carrier signal composed of K modulated carriers can be characterized in an N-dimensional space, with N>K, and that this N-dimensional space can be decomposed into a signal subspace of dimension K, and an orthogonal 'noise' subspace of dimension (N−K). In the absence of nonlinearity, the signal subspace contains all, or almost all the signal energy, while the noise subspace is a space with no, or almost no signal energy. In the presence of nonlinearity, however, the inter-modulation and intra-modulation products cause energy to leak into the 'noise' subspace in the form of distortion energy, thereby reducing the ratio of the signal subspace energy to the noise subspace energy. The reduction in the ratio is generally proportional to the nonlinearity in the transmission chain, which effect on the FM signal can be lessen by using a pre-distortion function, or a set of pre-distortion parameters, which maximize the signal energy to distortion energy ratio (SDR). This novel technique is described hereinbelow in detail with reference to exemplary embodiments of the method and circuit of the present invention.

To assist in the description, the following notations and definitions will be used hereinbelow. The input FM signal 3 is assumed to be comprised of a plurality of independent frequency channels, with integer K>1 denoting the number of the frequency channels that are present in the FM signal. The terms "multi-carrier" and "frequency multiplexed" are used in this specification interchangeably to refer to signals formed of multiple carrier signals having different carrier frequencies. The term "frequency channel" refers to a modulated carrier signal $s_k(t)$ having a carrier frequency $\Omega_k = 2\pi f_k$ that is specific to the frequency channel; here, k=1, . . . , K is an integer channel index. Mathematically, k-th carrier signal can be described by equation (1):

$$s_k(t) = a_k(t)e^{j(\Omega_k t + \phi_k(t))}, \quad (1)$$

where $a_k(t)$ denotes an amplitude, and $\phi_k(t)$ denotes a phase of the k-th channel signal, and t denotes time.

In one embodiment, the K frequency channels are multiplexed by summing their respective signals in the base-band. A base-band representation of the FM signal at the input port 7 of the NLC 37, which is denoted herein as x(t), may be mathematically expressed with the following equation (2):

$$x(t) = \sum_{k=1}^{K} a_k(t)e^{j(\Omega_k t + \phi_k(t))}, \quad (2)$$

In operation, the non-linear circuit 37 introduces undesirable nonlinear distortions into the FM signal; a baseband representation of the output FM signal 5 produced by the NLC 37 at its output port 9 will be denoted y(t). The term "nonlinear circuit" is used herein to mean a circuit which, upon receiving an input signal at its input port, outputs an output signal that is nonlinearly related to the input signal, so that for example an output power from the circuit is scaling nonlinearly with an input power into the circuit.

Exemplary embodiments of the present invention described herein relate to nonlinear circuits 37, which output signal y(t) has both a desired linear component with respect to the input signal x(t), and an undesired nonlinear component with respect to the input signal x(t), with the undesired nonlinear component also referred to as the nonlinear distortion. By way of example, the non-linear circuit 37 may be an amplifier having a linear gain coefficient $g_1$, in which case the output FM signal can be expressed as follows:

$$y(t) = g_1 \cdot x(t) + d_x(t) \quad (3)$$

Here $d_x(t)$ denotes the nonlinear distortion introduced by the non-linear circuit 37; d(t) is a nonlinear function of the input FM signal x(t) and is defined by nonlinear characteristics of the amplifier 37. To simplify the following description, we will assume hereinafter that the linear gain coefficient $g_1=1$; it will be appreciated however the method described herein remains valid for any value of the linear gain coefficient.

In many practical applications, the presence of this nonlinear distortion in the output FM signal 5 is undesirable. Accordingly, the function of the feedback circuit 99 is to first estimate the nonlinear distortion of the output FM signal, and then, based on this estimation, select a suitable pre-distortion function for the pre-distorter 33 so as to minimize, or at least reduce the nonlinear distortion in the output FM signal to a suitably low level.

The operation of the feedback circuit 99 can be generally described as follows. First, the output FM signal 5, or a fraction thereof in accordance with a tapping ratio of the tap-off coupler 45, is received by the sampler 65. The sampler 65 samples, i.e. measures, the received output FM signal 5 at a sampling rate $r_s$ that meets the Nyquist sampling theorem for covering the whole frequency band spanned by the K frequency channels. Denoting the total frequency bandwidth occupied by the K channels as $B_K$, this corresponds to a requirement that $$r_s > 2B_K. \tag{4}$$

The sampler 65 outputs a sampled FM signal 128 in the form of a sequence of signal samples y(n), where discrete index n=1, 2, . . . denotes consecutive signal samples. Using equations (1) to (3) and the discrete time index n, the signal samples at the output of the sampler 65 can be described as $$y(n) = x(n) + d_x(n) = \sum_{k=1}^{K} a_k(n) e^{j(\Omega_k n + \phi_K(n))} + d_x(n) \tag{5}$$

The sampled signal y(n) is provided to the CMC 11, which computes therefrom a correlation matrix R of a size N×N, wherein N denotes the number of columns and the number of rows in the matrix R; N is greater than K and is referred to herein as the matrix order. In the context of this specification, computing a matrix is understood as computing all matrix elements necessary to define the matrix, and storing them in a computer readable memory in an ordered manner so that any matrix element R(i,j) can be accessed when needed, wherein indices i and j denote columns and rows of the matrix, respectively. The matrix order N can be any value larger than the number of carriers K. If K is known, one convenient choice is N≈2K, so that both the signal subspace and the noise subspace have about the same dimension. If K is unknown, it can be estimated from the measurement, for example by using an information theoretic criterion such as Akaike's information-theoretic criterion (AIC) or the minimum description length criterion (MDL), which are known in the art, or based on eigenvalue distribution as described hereinbelow.

Based on the computed correlation matrix, or more particularly on a ratio of its eigenvalues corresponding to the signal and noise sub-spaces, the SDR computer 14 generates an estimate of the SDR, or a value related thereto; this estimate provides a convenient measure of the nonlinear distortion in the FM signal at the output of the NLC 37.

By repeating this process of SDR measurement, i.e. sampling the output signal, computing the correlation matrix and estimating therefrom the SDR, while varying a pre-distortion function that the pre-distorter 33 applies to the input FM signal 3, a suitable pre-distortion function can be found that pre-compensates for the non-linear distortion in the NLC 37, so as to increase the SDR to a suitably high level.

The process of the SDR measurement based on the received FM signal can be further understood by analyzing properties of the correlation matrix of the sampled output FM signal 128.

The correlation matrix R of size N×N can be mathematically expressed using vector notations as follows $$R = E\{y \cdot y^H\} \tag{7}$$

wherein superscript 'H' denotes the complex-conjugate and transpose of a matrix or vector, $E\{\ \}$ denotes an ensemble averaging, and y is a vector composed of N consecutive signal samples y(n+1) to y(n+N); it represents a sub-section of the sampled signal 128 of length N starting with the sample y(n+1) and consisting of a sequence of N signal samples:

$$y = \begin{pmatrix} y(1) \\ y(2) \\ \vdots \\ y(N) \end{pmatrix}, \tag{8}$$

In equation (8) the discrete time index n is dropped since the averaging $E\{\ \}$ in equation (7) is performed over a large range of the starting sample indices n.

The correlation matrix R of a sampled signal is a symmetrical matrix, which i, j entry R(i, j) is an auto-correlation coefficient of the sampled signal with a discrete time delay (i−j), i.e. an average value of a product of a first signal sample y(n−i) by a second signal sample y(n−j) that is delayed from the first signal sample by (i−j) samples, $1 \leq i,j \leq N$:

$$R(i,j) = E\{y(n-i) \times y^*(n-j)\}. \tag{6}$$

wherein superscript '*' denotes the complex conjugate of a complex number. The ensemble averaging $E\{\ \}$ in equation (6) can be approximated by an averaging over a suitably long section of the sampled signal 128, preferably containing more than one, and most preferably many, for example 100 or greater, symbol periods of each of the modulated carriers $s_k(t)$. For a stationary signal, i.e. a signal which statistical properties do not depend on time, equation (6) can be re-written as:

$$R(i,j) = R^*(j,i) = E\{y(n) \times y^*(n+i-j)\} = r(i-j), \tag{6a}$$

wherein the discrete sample delay |i−j| varied between 0 and N−1, and r(i−j)=r*(j−i). Accordingly, in one embodiment computing the correlation matrix R may involve computing at least N different auto-correlation coefficients r(p) of the sampled signal, corresponding to the sample delay values p between 0 and N−1, and saving them in computer-readable memory for use as elements of the correlation matrix R according to R(i,j)=r(i−j) in further processing. In one embodiment, each of the at least N different auto-correlation coefficients r(p) is computed by accumulating, for a section of the sampled signal 128 spanning multiple modulation periods of each of the frequency channels, pair-wise products of signal samples y(n)·y*(n−p) having a same inter-sample delay p, wherein p is an integer in a range from 0 to (N−1), and computing an average value thereof.

Although the nonlinear distortion $d_x(t)$ depends on the input signal x(t), it is uncorrelated linearly with the input signal, i.e., $$E\{d_x(t)x(t)\} = 0. \tag{9}$$

From equations (9), (7) and (5) it follows that the correlation matrix R can be represented as a sum of a correlation matrix $R_1$ of the input FM signal x(t), and a correlation matrix $R_d$ of the nonlinear distortion component $d_x(t)$, i.e.:

$$R = R_1 + R_d \tag{10}$$

wherein $$R_d = E\{d \cdot d^H\}, \tag{11}$$

$$d = \begin{pmatrix} d_x(1) \\ d_x(2) \\ \vdots \\ d_x(N) \end{pmatrix}$$

The nonlinear distortion component $d_x(t)$ is composed of multiple inter-modulation products among the K input carrier signals, as well as the intra-modulation products thereof. The stronger is the nonlinearity of the NLC 37, the higher is the relative strength of the inter-modulation and intra-modulation products.

In the following we will denote the correlation matrix R in the absence of the nonlinear distortion, i.e. when $d_x(n)=0$, as $R_1$, and in the presence of the non-linear distortion as $R_2$. It can be shown that $R_1$ has a rank that does not exceed the number of the independent carriers K, provided that the following conditions are satisfied: i) high sampling rate: bandwidth B of each carrier signal $s_k(t)$ is much smaller than the sampling rate $r_s$, i.e. $B<<r_s$, so that the amplitude and phase of each of the modulated carriers $s_k(t)$ remains substantially constant over each N consecutive sampling points, and ii) independent channels: the carriers $s_k(t)$ are modulated by uncorrelated signals and are therefore statistically independent. Under these conditions the correlation matrix $R_1$ has only K positive eigenvalues, and the remaining (N–K) eigenvalues are all zero.

Accordingly, denoting the K non-zero eigenvalues by $\gamma_1, \gamma_2, \ldots \gamma_K$ arranged in the descending order, $R_1$ can be expressed as $$R_1 = U\Lambda_1 U^H = U \begin{pmatrix} \gamma_1 & & & & & \\ & \ddots & & & & \\ & & \gamma_K & & & \\ & & & 0 & & \\ & & & & \ddots & \\ & & & & & 0 \end{pmatrix} U^H \quad (12)$$

where U is an N×N unitary matrix whose columns are N eigenvectors, and which satisfies the equation $U^{-1}=U^H$.

Based on this property of $R_1$, we can decompose the N-dimensional space spanned by the N eigenvectors into two subspaces: the signal subspace of a dimension K, which is spanned by K eigenvectors associated with K largest eigenvalues $\gamma_1, \gamma_2, \ldots \gamma_K$, and the orthogonal subspace of a dimension of (N–K), which is spanned by the remaining eigenvectors associated with (N–K) zero eigenvalues $\gamma_{1K+1}, \ldots \gamma_N$, and which will be referred to herein as the noise subspace or the distortion subspace. With this signal subspace decomposition, the K largest eigenvalues represent the total energy in the signal subspace, while the 'noise' subspace in the absence of the nonlinear distortion contains no energy, that is all the 'noise' eigenvalues $\gamma_{1K+1}, \ldots \gamma_N$ are zero.

In the presence of the nonlinear distortion, $R_d$ has non-zero elements and is typically a positive definite matrix when $d_x(t)$ contains many high order inter-modulation and intra-modulation products. This is true as long as the number of inter-modulation and intra-modulation products is larger than the dimension of $R_d$, which typically holds as long as N is not very large, say, N~2K. Consequently, all of the N eigenvalues of the matrix R are positive, or at least non-negative.

Accordingly, if the number of substantially non-zero eigenvalues exceeds K, it indicates that the signal energy is spread over the noise subspace instead of being contained in the K-dimensional signal subspace as in the case of linear amplification. In other words, due to the nonlinear distortion, part of the signal energy is converted into noise-like components residing in the noise subspace, thereby reducing the signal energy in the signal subspace. In a general case, with the correlation matrix of the FM signal in the presence of the nonlinear distortion denoted as $R_2$, the eigen-value decomposition of the correlation matrix take the form $$R_2 = V\Lambda_2 V^H = V \begin{pmatrix} \lambda_1 & & & \\ & \lambda_2 & & \\ & & \ddots & \\ & & & \lambda_N \end{pmatrix} V^H \quad (13)$$

where V is the eigenvector matrix of the correlation matrix $R_2$, and $\gamma_1, \gamma_2, \ldots \gamma_K$ are eigenvalues of the correlation matrix $R_2$ arranged in a descending order. Then the K largest eigenvalues $\lambda_1, \lambda_2, \ldots, \lambda_K$ represent the energy in the signal subspace, while the (N–K) smallest eigenvalues $\lambda_{1+K}, \ldots, \lambda_N$ represent the energy in the noise subspace.

Therefore the signal-to-distortion ratio (SDR), which characterizes the FM signal quality in the presence of the nonlinear signal distortion, can be estimated based on a ratio of the eigenvalues corresponding to the signal and the noise subspaces, respectively. Particularly, the SDR may be estimated as a ratio of a sum of the K largest eigenvalues $\lambda_1, \lambda_2, \ldots, \lambda_K$ a sum of the (N–K) smallest eigenvalues of the correlation matrix $R_2$:

$$SDR = \frac{\sum_{n=1}^{K} \lambda_n}{\sum_{n=K+1}^{N} \lambda_n} \quad (14)$$

The larger is the SDR, the better is the signal quality or the less is the effect of the nonlinear distortion on the signal. In the ideal case without nonlinearity and in the high-sampling-rate approximation, $\lambda_{1+K}=\lambda_{2+K}=\ldots=\lambda_N=0$, and the SDR is infinite.

To reduce the nonlinear distortion of the output FM signal 5, the input FM signal 3 is pre-distorted by the pre-distorter 33, such using an adjustable pre-distortion function, before the signal passes through the NLC 37. The pre-distortion function should have nonlinear characteristics inverse to the nonlinear characteristics of the NLC 37, so that when the pre-distorted signal passes through the PA, the nonlinear effect is cancelled out at the PA's output.

This pre-distortion function, or one or more adjustable parameters defining it, is generated by the pre-distortion generator 17 in dependence upon the SDR value computed by the SDR computer 14, or an objective function value related thereto, so as to increase the SDR. Different methods can be used to search for a suitable pre-distortion function that maximizes the SDR; for example, the controller 88 may be programmed to scan through a plurality of values of the one or more adjustable parameters that define the pre-distortion function, at each step measuring and saving corresponding SDR values, and then select those values of the adjustable parameters that provide the greatest SDR. One such exemplary algorithm is provided hereinbelow.

Accordingly, the process of compensating for the nonlinear distortion of the FM signal traversing through the NLC 37 can be described as follows:

a) the input FM signal is pre-distorted prior to passing thereof through the nonlinear circuit in accordance with one or more adjustable pre-distortion parameters using the pre-distorter 33;

b) after passing through the NLC 37, the FM signal, or at least a portion thereof, is received by the feedback circuit 99 as a received output FM signal;

c) in the feedback circuit 99, the received output FM signal is sampled by the sampler 65 to obtain a sampled signal 128 comprising a sequence of signal samples y(n);

d) based on the sampled signal 128, the CMC 11 computes a signal correlation matrix of size N×N, wherein N>K;

e) this correlation matrix is then used by the SDR computer 14 to generate an SDR estimate.

Steps a) to e) may then be iteratively repeated while varying the one or more adjustable pre-distortion parameters in such a way so as to increase the SDR.

Exemplary embodiments of the invention will now be described in further detail with reference to a quadrature multi-carrier (QMC) transmitter employing a power amplifier (PA) having a non-linear input-output characteristic, which is compensated for using the technique generally described hereinabove.

Figure 2:
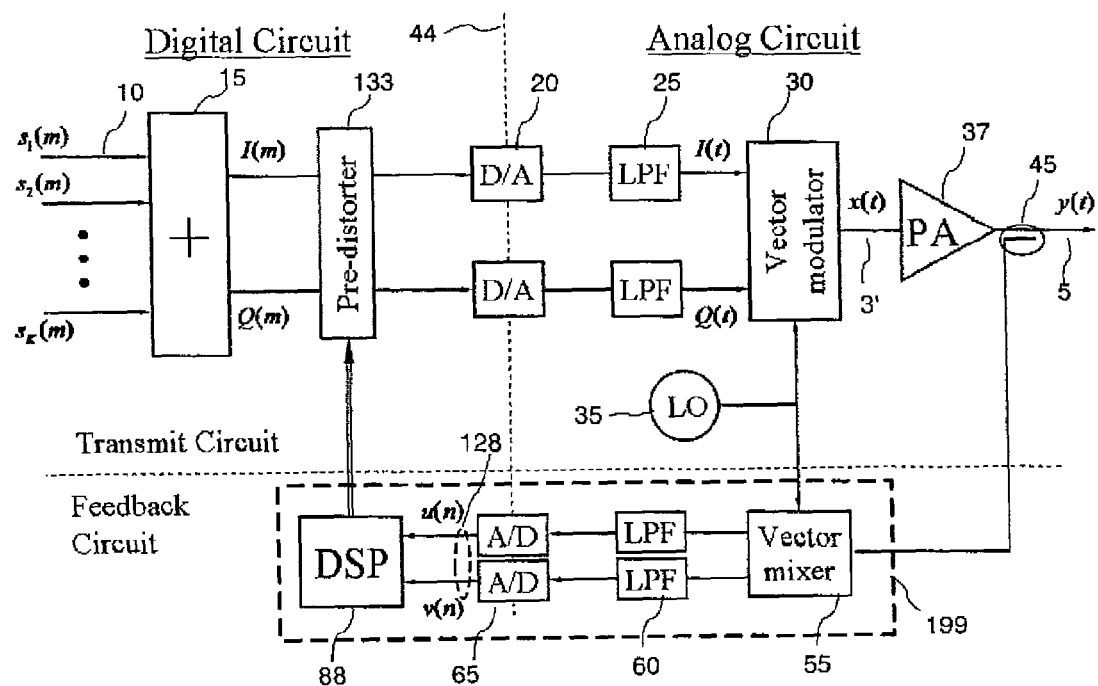
FIG. 2 is a schematic block diagram of a 1st implementation of a quadrature multi-carrier transmitter with pre-compensation of non-linear distortions and a vector down-conversion in a feedback circuit.

Referring first to FIG. 2, there is shown a simplified block diagram of a QMC transmitter circuit 100, which is referred to hereinafter simply as a transmitter 100. The transmitter 100 has a digital circuit portion and an analog circuit portion which are indicated with a dotted separation line 44 therebetween. The transmitter 100 can be viewed as an embodiment of the circuit 1, wherein the NLC 37 is in the form of a power amplifier (PA); accordingly, in this and similar embodiments the NLC 37 will also be referred to as the PA 37. In accordance with a known in the art arrangement, the PA 37 receives the input FM signal 3' from a vector modulator 30. In this embodiment, the FM signal 3' that is passed through the PA 37 is generated from K discrete quadrature-modulated channel signals $s_k(m)$, k=1, 2, . . . , K. These discrete channel signals are digitally summed together using a digital signal multiplexer 15, with a pre-assigned frequency allocation at respective carrier frequencies $\Omega_1$, $\Omega_2$, . . . , $\Omega_K$, denoted in an ascending order for convenience of description. This frequency allocation is relative to an RF carrier frequency $\Omega_{RF}$ that is generated by a local oscillator (LO) 35 as known in the art. To distinguish from the RF carrier frequency $\Omega_{RF}$, the carrier frequencies $\Omega_K$ will also be referred to in this embodiment as subcarrier frequencies.

The K discrete channel signals $s_k(m)$ can be mathematically described using equation (1), substituting the discrete time, or symbol period, index in in place of the continuous time variable t, with $a_k(m)$ and $\phi_k(m)$ being amplitude and phase, respectively, of the k-th discrete channel signal. The discrete time index m may indicate time slots of consecutive information symbols with which the sub-carrier frequencies $\Omega_k$, k=1, 2, . . . , K, are modulated. It is assumed that these K discrete channel signals $s_k(m)$ are statistically independent of each other, and that their individual bandwidths B are small relative to the total bandwidth $B_K$ that they occupy after the multiplexing, and relative to the sampling rate $r_s$ used in the feedback circuit 199.

In the digital multiplexer 15, the summed signal is split into an in-phase component I(m) and a quadrature component Q(m), which are then converted to analog waveforms, denoted by I(t) and Q(t), respectively, by two digital to analog (D/A) converters 20 after passing through a pre-distorter 133. The analog in-phase and quadrature components I(t) and Q(t) are then passed to the vector modulator 30, wherein they are used to modulate an amplitude and phase of the RF carrier signal generated by the LO 35. The resulting analog FM signal 3', which baseband representation is denoted x(t), is amplified by the PA 37, and is output therefrom in the form of the output FM signal 5, which baseband representation is denoted y(t).

The PA 37 is a nonlinear device, and its output signal y(t) can be mathematically described with equation (3), with the nonlinear distortion term $d_x$ being dependent upon nonlinear characteristics of the PA 37 and the input signal x(t). To compensate for this non-linearity, the transmitter 100 includes the pre-distorter (PD) 133 and a feedback circuit 199, which have generally the same functionality as the PD 33 and feedback circuit 99, respectively, described hereinabove with reference to the circuit 1 of FIG. 1.

More specifically, the pre-distorter 133 operates in the digital domain, applying a non-linear pre-distortion function to the received digital I an Q signals so as to generate a pre-distorted digital FM signal in the form of two quadrature I and Q signal components, which will be denoted $I_D(m)$ and $Q_D(m)$, respectively. In one embodiment the pre-distortion function is a complex-valued function of the amplitude a of the FM signal at the input of the pre-distorter 33; denoting it as $D(a|c_1, c_2)$, this pre-distortion function may be generally described with the following equation:

$$D(a|c_1,c_2)=A(a|c_1)e^{j\Psi(a|c_2)} \qquad (15)$$

In this equation, $c_1=(c_{11}, c_{12}, \ldots, c_{1L})$ is a vector of L parameters for an amplitude pre-distortion function $A(a|c_1)$, $c_2=(c_{21}, c_{22}, \ldots, c_{2J})$ is a vector of J parameters for a phase pre-distortion function $\Psi(a|c_2)$. The amplitude predistortion function $A(a|c_1)$ is useful to cancel out the PA's AM-AM conversion, and the phase predistortion function $\Psi(a|c_2)$ is useful to cancel out the PA's AM-PM conversion. The integers L and J define the number of adjustable parameters used by the pre-distorter 33, and can generally each be equal or greater than zero, but cannot be both equal to zero, so that there is at least one adjustable pre-distortion parameter that can be varied to adjust the pre-distortion function. In operation, these parameters are generated and/or varied by the pre-distortion generator 17 in the controller 88.

By way of example, the pre-distorter 133 may generate the pre-distorted signals $I_D(m)$ and $Q_D(m)$ from the input quadrature FM signals I(m) and Q(m) according to the following equations:

$$I_D(m) + jQ_D(m) = \frac{D(a|c_1, c_2)}{a}(I(m) + jQ(m)) \qquad (16)$$

where $$a=\sqrt{I^2(m)+Q^2(m)} \qquad (17)$$

is the amplitude of the input FM signal into the pre-distorter 33.

In one embodiment, the amplitude and phase distortion functions are polynomial functions of the FM signal amplitude a, and are defined as follows:

$$A(a,c_1)=c_{11}a+c_{12}a^2+ \ldots +c_{1L}a^L \qquad (18)$$

and $$\Psi(a,c_2)=c_{21}a+c_{22}a^2+ \ldots +c_{2J}a^J. \qquad (19)$$

In other embodiments other forms of the pre-distortion function may be used, including but not limited to Volterra series, Fourier series, and rational functions.

The feedback circuit 199 includes the controller 88 for controlling the pre-distorter 133, and the sampler 65 embodied herein with two analog to digital (A/D) converters. Additionally, the feedback circuit 199 includes a vector mixer 55 followed by two low-pass filters (LPF) 60 connected between the mixer 55 and the A/D converters 65. In operation, a fraction of the FM signal y(t) from the output of the PA 37 is directed by the tap coupler 45 to the vector mixer 55. The mixer 55 down-converts the received fraction of the output FM signal 5 to the baseband by mixing it with the RF carrier signal supplied by the LO 35, and outputs the down-converted received FM signal in the form of baseband in-phase and quadrature signal components u(t) and v(t), which are then low-pass filtered by the LPFs 60 and sampled by the sampler 65 to generate the sampled signal 128 in the form of discreet real-valued I/Q signals u(n) and v(n), wherein $y(n)=u(n)+j\cdot v(n)$, that are fed to the controller 88. The controller 88 then computes the correlation matrix $R_2$, and computes the $R_2$ eigenvalues or estimates a ratio thereof for the signal and noise sub-spaces to obtain an SDR estimate, and updates the pre-distortion parameters in dependence upon the estimated SDR as generally described hereinabove, and as more specifically described hereinbelow with reference to a specific exemplary embodiment. The controller 88 can be implemented using a digital signal processor (DSP), as indicated by way of example in the figure. One skilled in the art would appreciate that other processing means can be used to implement the controller 88, such as but not limited to: a general purpose processor, a specialized microprocessor, an FPGA (field programmable gate array), an ASIC (application-specific integrated circuit), or a combination of the above. In some embodiments, the controller 88 and the PD 133 can be implemented using a single processor, such as a single FPGA.

Once the input FM signal is pre-distorted with the pre-distortion function $D(a|c_1, c_2)$, the output FM signal 5 from the PA 37 becomes dependent upon the pre-distortion function. Consequently, the correlation matrix $R_2$, and hence the corresponding SDR computed by the controller 88 depend upon the adjustable sets of parameters $c_1$ and $c_2$, i.e. $SDR=SDR(c_1, c_2)$. The pre-distortion function, or a set of parameters defining thereof, such as elements of $c_1$ and/or $c_2$, is uploaded to the pre-distorter 133 to pre-distort the PA's input signal, for example in accordance with equation (16). The process is iterative, and the controller 88 can continuously make adjustment to the pre-distorter 133 so as to maximize the SDR of the FM signal 5 at the output of the PA 37.

The use of the vector mixer 55 in the feedback circuit 199 of the transmitter 100 enables to capture substantially all information about the FM signal y(t) at the PA output, and use it to estimate the SDR and optimize the pre-distortion function. However, the use of the vector mixer 55 may introduce undesired gain and phase imbalances between the two output I an Q signals u(t) and v(t), which may yield inaccurate SDR estimates and degrade the distortion compensation performance, unless corrective measures are taken. In addition, the vector down-conversion scheme of FIG. 2 requires two low-pass filters 60 and two A/D converters 65 in the feedback circuit 199.

Figure 3:
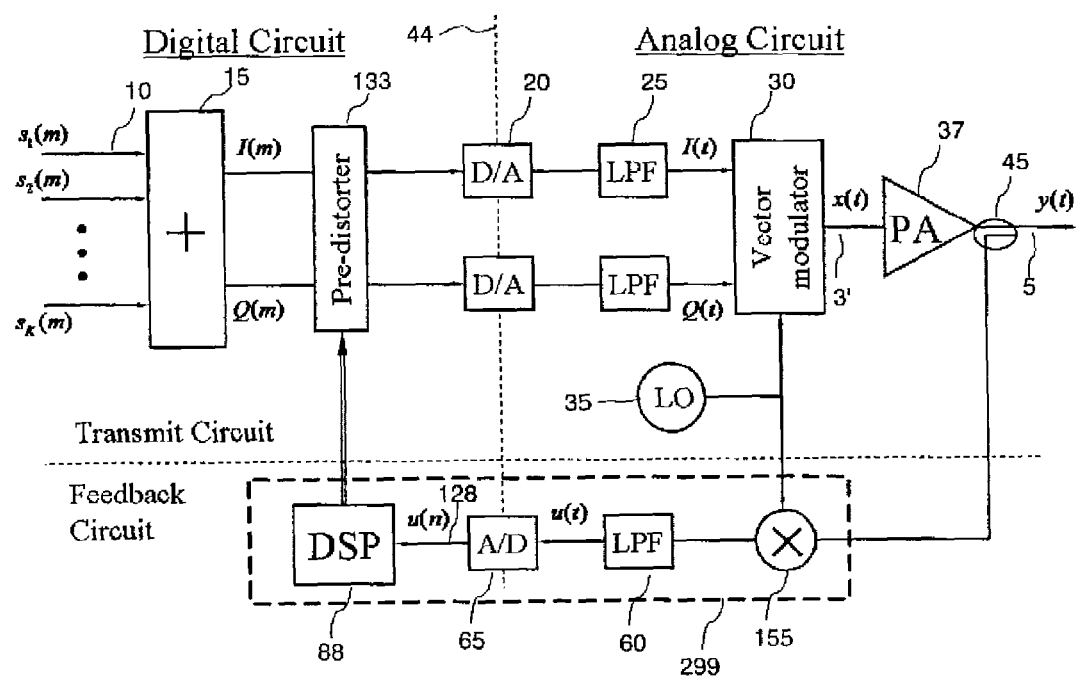
FIG. 3 is a schematic block diagram of a 2nd implementation of a quadrature multi-carrier transmitter with pre-compensation of non-linear distortions and a scalar down-conversion in the feedback circuit.

Referring now to FIG. 3, there is illustrated a QMC transmitter circuit 200, which can be viewed as an embodiment of the transmitter 100 with a simplified feedback circuit 299 implementing a scalar down-conversion and sampling. In this implementation, which is referred to hereinafter as implementation #2 to distinguish from that of FIG. 2 which is referred to as implementation #1, a single scalar mixer 155, and consequently single LPF 60 and single A/D converter 65 are used to down-convert the output FM signal 5 to baseband to form the received output FM signal, which is now scalar, i.e. represent by a single real-valued waveform, and to sample a resulting down-converted scalar signal u(t) at the sampling rate r to obtain a sampled signal u(n). The LPF bandwidth and the sampling rate $r_s$ requirement remain the same as those for the implementation of FIGS. 1 and 2.

The sampled scalar signal in the form of a sequence of signal samples u(n) is used by the controller 88 to directly construct the correlation matrix R. In this embodiment the correlation matrix R is real-valued, as opposed to the complex-valued R in the embodiment of FIG. 2, which is in turn used to estimate the SDR based on a ratio of the eigenvalues of the correlation matrix. Since the scalar, i.e. real-valued sequence of signal samples u(n) contains nonlinear distortion information, it may be used to derive the pre-distortion function. Statistically, however, there may be some performance degradation due to the fact that effectively only one half of samples is used. This performance loss can be mitigated by increasing the length of the sample sequence that is used to compute the correlation matrix R. The hardware saving in this scalar implementation of the feedback circuit is apparent, and the gain/phase imbalances due to the vector mixer are advantageously avoided.

Figure 4:
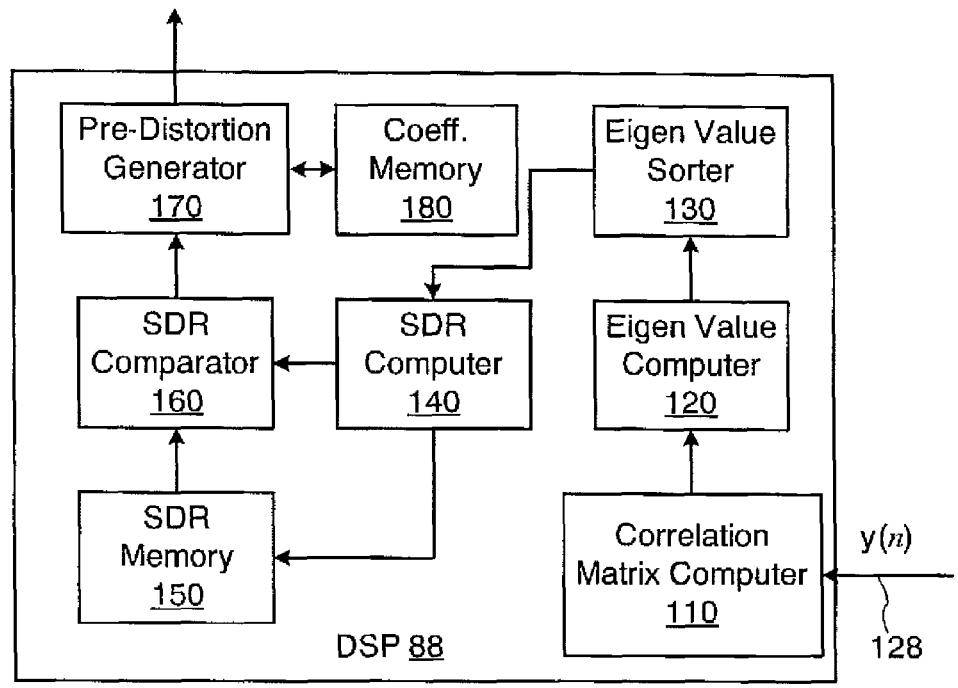
FIG. 4 is a schematic block diagram of an exemplary pre-distorter controller according to an embodiment of the present invention.

With reference to FIG. 4, there is shown a functional block diagram of the controller 88 in one embodiment thereof. The controller 88 in this embodiment includes at its input the CMC 110, which is operatively followed by an eigenvalues computer (EVC) 120, which is in turn followed by an eigenvalues sorter (EVS) 130, which in turn connects to an SDR computer 140. An output of the SDR computer 140 is coupled to an SDR memory 150 for storing the SDR values or objective function values $O_{SDR}$ related thereto. An SDR comparator 160 is operatively coupled between the SDR computer 140 and a pre-distortion generator (PDG) 170, and is further coupled to the SDR memory 150 for comparing values stored therein to a current value of the SDR obtained from the SDR computer 140. An output of the pre-distortion generator 170 is coupled to the pre-distorter (PD) 133.

In operation, the CMC 110 receives the sampled signal 128, and generates therefrom the correlation matrix R, or equivalently, all distinct elements thereof; since the correlation matrix is symmetric, it has at most $N\cdot(N-1)/2$ distinct elements, and may have only N distinct elements corresponding to N auto-correlation coefficients, with all other matrix elements obtainable therefrom. Operation of the CMC 110 is generally described hereinabove, and is described more in detail hereinbelow with reference to FIG. 5 for an exemplary embodiment.

The EVC 120 obtains from the CMC 110 all necessary matrix elements C(i,j), and computes eigenvalues thereof $\lambda_i$ using known in the art methods, such as transforming the correlation matrix R to a diagonal form using eigenvalues decomposition of the form represented by equation (13). The EVS 130 receives the eigenvalues from the EVC 120, sorts them in an ascending or descending order to identify one or more, and up to K, largest signal-related eigenvalues, and passes them to the SDR computer 140 for computing the SDR or an objective value $O_{SDR}$ related thereto.

In one embodiment, the SDR computer uses equation (14) to compute the SDR as a ratio of a sum of K largest eigenvalues to a sum of the remaining, i.e. (N–K) smallest, eigenvalues.

In another embodiment, the EVS 130 and EVC 120 may be omitted, and the SDR computer obtains coefficients of the correlation matrix R from the CMC 110 to estimate the SDR directly, without first finding the eigenvalues. In one such embodiment, the SDR computer estimates the SDR based on a condition number of the correlation matrix R, which is a ratio of the largest eigenvalue $\lambda_1$ to a smallest eigenvalue $\lambda_N$, i.e. in accordance with the equation $$SDR = \frac{\lambda_1}{\lambda_N}. \quad (20)$$

The condition number of a matrix may be approximately computed using known in the art methods without separately computing the largest and smallest eigenvalues. Utilizing the SDR defined by equation (20) as a feedback signal in optimization of the pre-distortion function may be advantageous when the ratio of the carrier bandwidth to the sampling rate r is relatively large, so as to cause the signal energy to spill over from the signal subspace to the noise subspace. This energy spill-over mainly concentrates in the boundary region between the signal subspace and the noise subspace, and thus would less affect the largest and smallest eigenvalues. By using the ratio of the largest eigenvalue and the smallest eigenvalue as an SDR estimate, the spill-over effect of the narrow-band signal approximation may be alleviated.

In other embodiments, the SDR computer 140 may implement an intermediate approach between those defined by equations (14) and (20), and take into account two or more largest eigenvalues when estimating the signal contribution, and/or two or more smallest eigenvalues when estimating the distortion contribution. Accordingly, the SDR computer may generate and SDR estimate according to an equation $$SDR = \frac{\sum_{n=1}^{K_1} \lambda_n}{\sum_{n=K_2+1}^{N} \lambda_n}, \quad (21)$$

wherein $K_1$ may range between 1 and K, and $K_2$ may range between K and N−1. Accordingly, the SDR may be generally computed as a ratio of one or more of the K largest eigenvalues to one or more of the (N−K) smallest eigenvalues. The nominator and denominator in the definition of the SDR may also be computed as linear combinations of the eigenvalues corresponding to the signal and noise sub-spaces, respectively. Which of the computed eigenvalues belong to the signal sub-space and the noise sub-space, and the number of multiplexed carriers K, may be determined in some embodiments by comparing the eigenvalues to a threshold value, and determining the number of the eigenvalues exceeding the threshold.

The computed SDR is provided to the SDR comparator 160, which compares it to an SDR value from a previous iteration stored in the SDR memory 150; the SDR memory 160 is then updated with the current SDR value for use as a reference in a next iteration. The pre-distortion generator 170 either increments or decrements the one or more adjustable pre-distortion parameters $c_i$ in dependence upon an output from the comparator 160.

In one embodiment, the pre-distortion generator 170 provides the updated values of the one or more adjustable pre-distortion parameters to the pre-distorter 133, which then generates the pre-distortion function $D(a|c_1, c_2)$ and applies it to the input FM signal $\{I(m), Q(m)\}$, for example as described hereinabove with reference to equation (16). In another embodiment, the pre-distortion function $D(a|c_1, c_2)$ is generated by the pre-distortion generator 170 for a plurality of values of the FM signal amplitude a, and then provided to the pre-distortion generator 133 in the form of a distortion look-up table wherein values of the pre-distortion function are stored in dependence upon the amplitude a, or the intensity $a^2$ of the input FM signal. This look-up table is stored in the pre-distorter 133 and used for pre-distorting the input FM signal till next iteration. The pre-distorter 133 computes the amplitude $a=\sqrt{I^2(m)+Q^2(m)}$ of the input FM signal $\{I(m), Q(m)\}$ for each received data symbol, and uses the distortion look-up table to generate the pre-distorted FM signal, which is then passed through the NLC 37. Note that in embodiments wherein both the controller 88 and the PD 133 are implemented in hardware using a single digital processor, such as a single FPGA or ASIC, in which case the functionality of generating the distortion look-up table may be attributed to either the PD 133 or the PDG 170.

In a next iteration, the aforedescribed process of sampling the output FM signal 5 from the NLC 37, computing the correlation matrix, estimating the SDR based on a ratio of its eigenvalues and updating the pre-distortion function is then repeated, so as to determine an optimized pre-distortion function that corresponds to a maximum SDR value, or increases the SDR value to a desired degree.

It will be appreciated that instead of using the SDR values obtained as defined by either of equations (14), (20) or (21) as a feedback parameter at consecutive iterations of the process of determining optimum values of pre-distortion parameters, one may chose to utilize an alternative objective function as such feedback parameter. For example, in one embodiment the SDR computer 140 generates an objective function value which is inversely proportional to the SDR, $O_{SDR}=A/SDR$, where A is a constant parameter, and this objective function value is then stored in the SDR memory 150 for comparing with an objective function value obtained in a next iteration. In this embodiment, the controller 88 would be programmed to search for a set of pre-distortion parameters that minimizes or decreases the objective function value, thereby maximizing or increasing the SDR. In other embodiments, other functions of the SDR can be computed and used as the objective function which value is being minimized or maximized in the iterations.

It will be further appreciated that a variety of optimization algorithms can be used to iteratively determine optimum values of the pre-distortion parameters that maximize, or at least suitably increase, the SDR value. By way of example, an alternate one-dimensional search algorithm for finding an optimal set of the pre-distortion parameters is described hereinbelow; other algorithms, such as the method of steepest descent, can also be used.

Alternate 1—Dimensional Search Algorithm

In the following description of the alternate 1-dimensional search algorithm, it is convenient to introduce a single set of pre-distortion parameters $c \equiv c_1 U c_2 \equiv (c_1, c_2)$ of length (L+J) composed of the two separate sets $c_1, c_2$ for the pre-distortion amplitude and phase functions given by equation (18) and (19); here, elements of the set c are given as $c_i=c_{1i}$ for i= 1, …, L, and $c_i=c_{2(i-L)}$ for i=L+1, …, L+J. In these notations, the pre-distortion function $D(a|c_1, c_2)=D(a|c)$. The alternate 1-dimensional search algorithm can then be described as a sequence of the following steps.

A) Initialization

A1) Select the correlation matrix dimension N, a search step size δ;

A2) Set the pre-distortion parameters to their default value, such as c=(1, 0, …, 0);

A3) Compute the pre-distortion function D(a|c), and upload it to the pre-distorter circuit; if only one of the amplitude and phase pre-distortion functions has changed, only that function may be updated and uploaded;

A4) Acquire a sequence of signal samples from the output of the PA 37;

A5) Compute the correlation matrix $R_2$, and determine its eigenvalues or the condition number thereof;

A6) Calculate the SDR based on the eigenvalues or the condition number, or an objective function value related thereto;

A7) Store the SDR, or the objective function value related thereto, it in the SDR memory;

B) Iterations:

B1) Select a first pre-distortion parameter $c_l$, l=1;

B2) Increment $c_l$ by $\delta$, i.e. set $c_l=c_l+\delta$

B3) Perform steps A3) to A6)

B4) Compare the SDR, or the objective function value related thereto, with a value stored in the SDR memory;

B5) If the objective function/SDR value changed in a desired direction, switch to a next pre-distortion parameter with l=l+1, and return to step B2); otherwise, decrease $c_{1l}$ by $2\delta$, i.e., $c_{1l}=c_{1l}-2\delta$, and perform steps B3) and B4);

B6) If the objective function value changed in the desired direction, switch to a next pre-distortion parameter with l=l+1 and return to step B2); otherwise, set $c_l=c_l+2\delta$, and continue;

B7) if l<L+J, set l=l+1, and return to step B2); otherwise, continue;

If a pre-set performance or operational requirement is met, stop the algorithm; otherwise, go to Step (B1) for the next iteration.

The recursive updating procedure in the alternate 1-dimensional search can be repeated whenever needed, either for both the amplitude and phase pre-distortion functions or for one of them. A variable step size can be used in the search to speed up the convergence during the initial stage, and to achieve a better performance when a steady state is reached.

Figure 5:
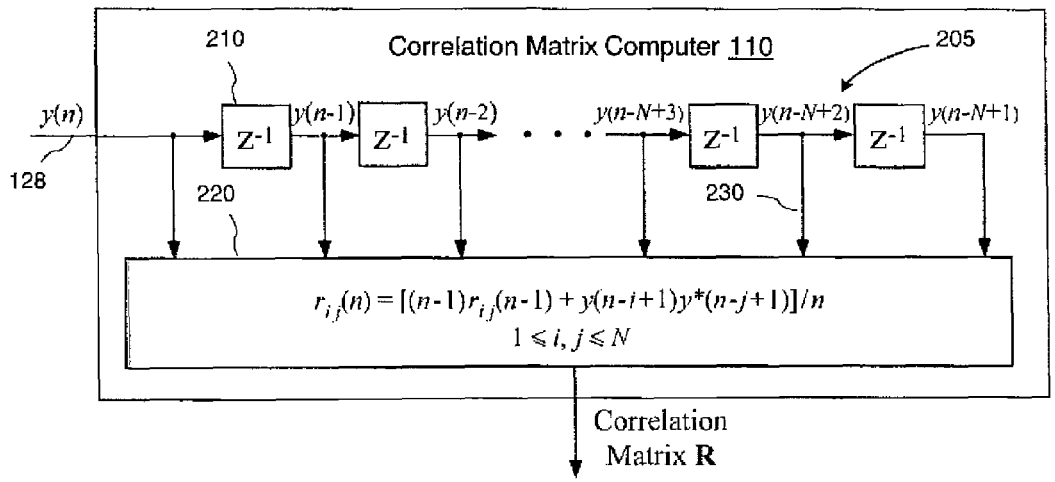
FIG. 5 is a schematic block diagram of a correlation matrix computing module according to an embodiment of the present invention.

Referring now to FIG. 5, there is shown a schematic block diagram of the correlation matrix computer 110 according to one embodiment of the invention. In this embodiment, the correlation matrix R is calculated from a section of the sampled signal 128 of a length M, i.e. consisting of a sequence of M signal samples, [y(n)]. This section of the sampled signal 128 of length M is referred to herein as a measurement sequence of signal samples, a measurement section of the sampled signal, or simply as a measurement sequence. To simplify the notations, the sample index n is assumed to count the signal samples from the beginning of the measurement sequence, i.e. n=1, 2, . . . , M, and the measurement sequence represented in the form [y(n)]≡[y(1), y(2), . . . , y(M)]. If the length M of the measurement sequence is greater than N, the correlation matrix R may be estimated from the measurement sequence in accordance with the following equation (22):

$$R = \frac{1}{M-N} \begin{pmatrix} y(1) & y(2) & \cdots & y(M-N+1) \\ y(2) & y(3) & & \\ \vdots & & \ddots & \vdots \\ y(N) & y(N+1) & \cdots & y(M) \end{pmatrix} \quad (22)$$

$$\begin{pmatrix} y(1) & y(2) & \cdots & y(M-N+1) \\ y(2) & y(3) & & \\ \vdots & & \ddots & \vdots \\ y(N) & y(N+1) & \cdots & y(M) \end{pmatrix}^H$$

The actual calculation of the correlation matrix R can be performed by the CMC 110 recursively to eliminate the need to store all M samples of the measurement sequence. The functional block diagram in FIG. 5 schematically shows one embodiment of the CMC 110 implementing recursive computing of the correlation matrix R. In this embodiment, the sampled signal 128 is received by a tapped delay line (TDL) 205 of length N, such as a serial-to-parallel shift register. The TDL 205 has N taps 230 coupled to an arithmetic/memory block 220, each tap 210 followed by a storage element 210 for storing successive signal samples y(n), y(n−1), . . . y(n−N+1), with all N storage elements 210 and taps 230 driven by a same clock. The arithmetic/memory block 220 has memory, which is referred to herein as the auto-correlation memory, for storing auto-correlation coefficients $r_{ij}$ of the sampled signal 128. The following recursive formula (23) may be used in the block 220 to calculate the auto-correlation coefficients and update the content of the autocorrelation memory:

$$r_{ij}(n) = \frac{1}{n}[(n-1)r_{ij}(n-1) + y(n+1-i)y^*(n+1-j)] \quad (23)$$

where i, j=1, 2, . . . , N, n=1, . . . , M, the superscript "*" denotes the complex conjugate of a complex-valued number, and $r_{ij}(n)$ denotes a value computed for the auto-correlation coefficient $r_{ij}$, or equivalently, the correlation matrix element R(i,j), when an m-th sample of the measurement sequence is received by the CMC 110.

In one embodiment, only N auto-correlation coefficients corresponding to N different values of the relative sample delay p=0, 1, . . . , N−1 are recursively calculated.

Once every M samples, the auto-correlation memory in block 220 is sampled, and its content assigned to elements R(i,j) of the correlation matrix R, R(i,j)=$r_{ij}$(M), after which it can be re-initialized to enable next measurement cycle.

Simulation Results

The aforedescribed nonlinearity estimation and linearization technique in the context of the PA linearization application in the multi-carrier transmitters has been verified using computer simulations. In the simulations, four carrier signals with different modulation schemes are generated according to the configurations of Table 1 and then frequency-multiplexed, to produce the input FM signal with the number of modulated carriers, or independent frequency channels, K=4.

TABLE 1

Signal configurations for simulations

| | Carrier#: | | | |
|---|---|---|---|---|
| | 1 | 2 | 3 | 4 |
| Modulation: | QPSK | 8-PSK | QPSK | 16-QAM |
| Symbol rate: | 1 MHz | 1 MHz | 1 MHz | 1 MHz |
| Roll-off: | 0.25 | 0.25 | 0.35 | 0.35 |
| Carrier frequency | 0 MHz | 2 MHz | 4 MHz | 6 MHz |

Sampling frequency = 16 MHz

Measured characteristics of a traveling wave tube amplifier (TWTA) and a solid state power amplifier (SSPA) which differ in their non-literalities, were used in the simulations to test the capability of the technique.

Figure 6:
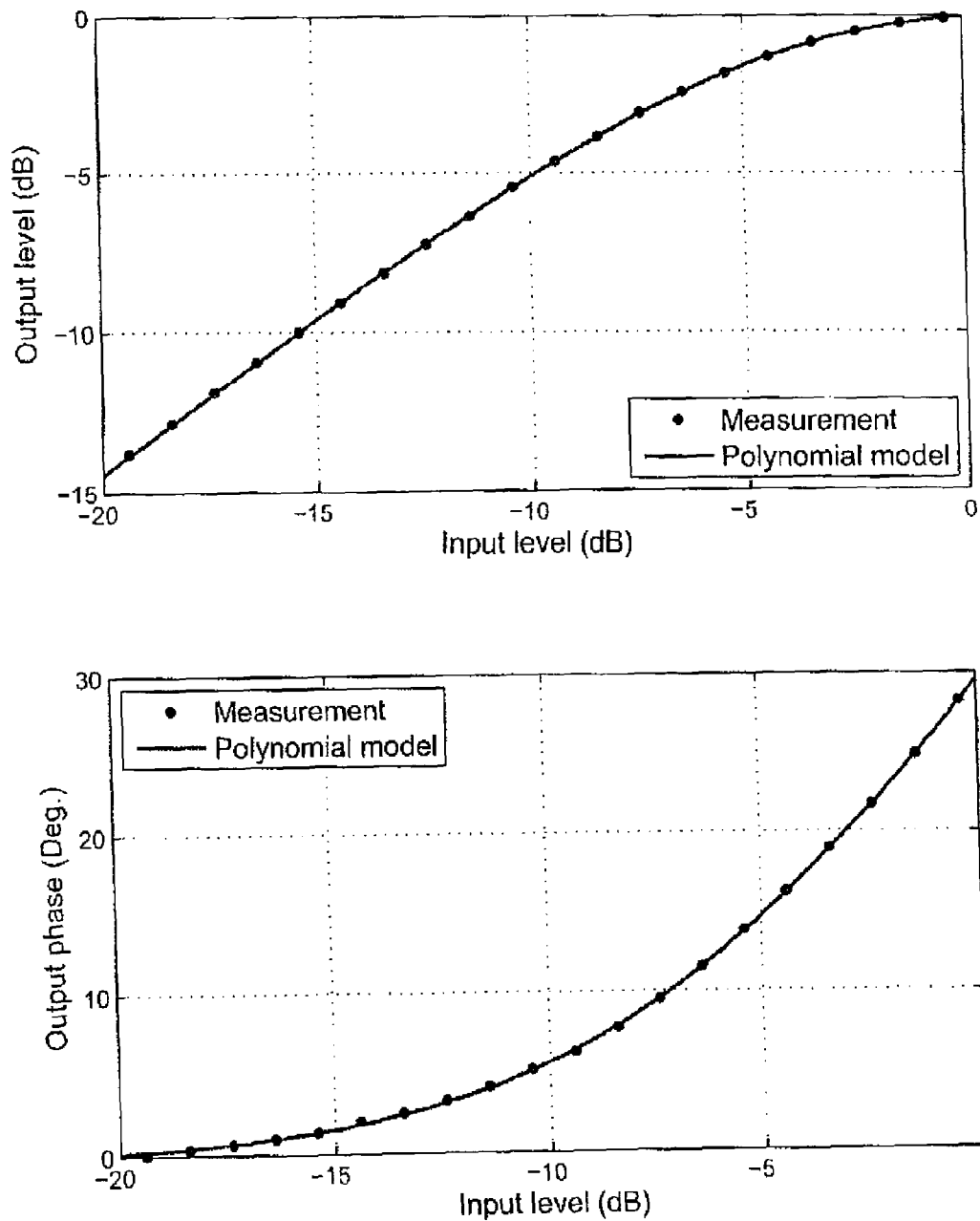
FIG. 6 is a graph showing plots of non-linear output amplitude (top panel) and phase (lower panel) characteristics of a PA#1 (traveling wave tube amplifier)
Figure 7:
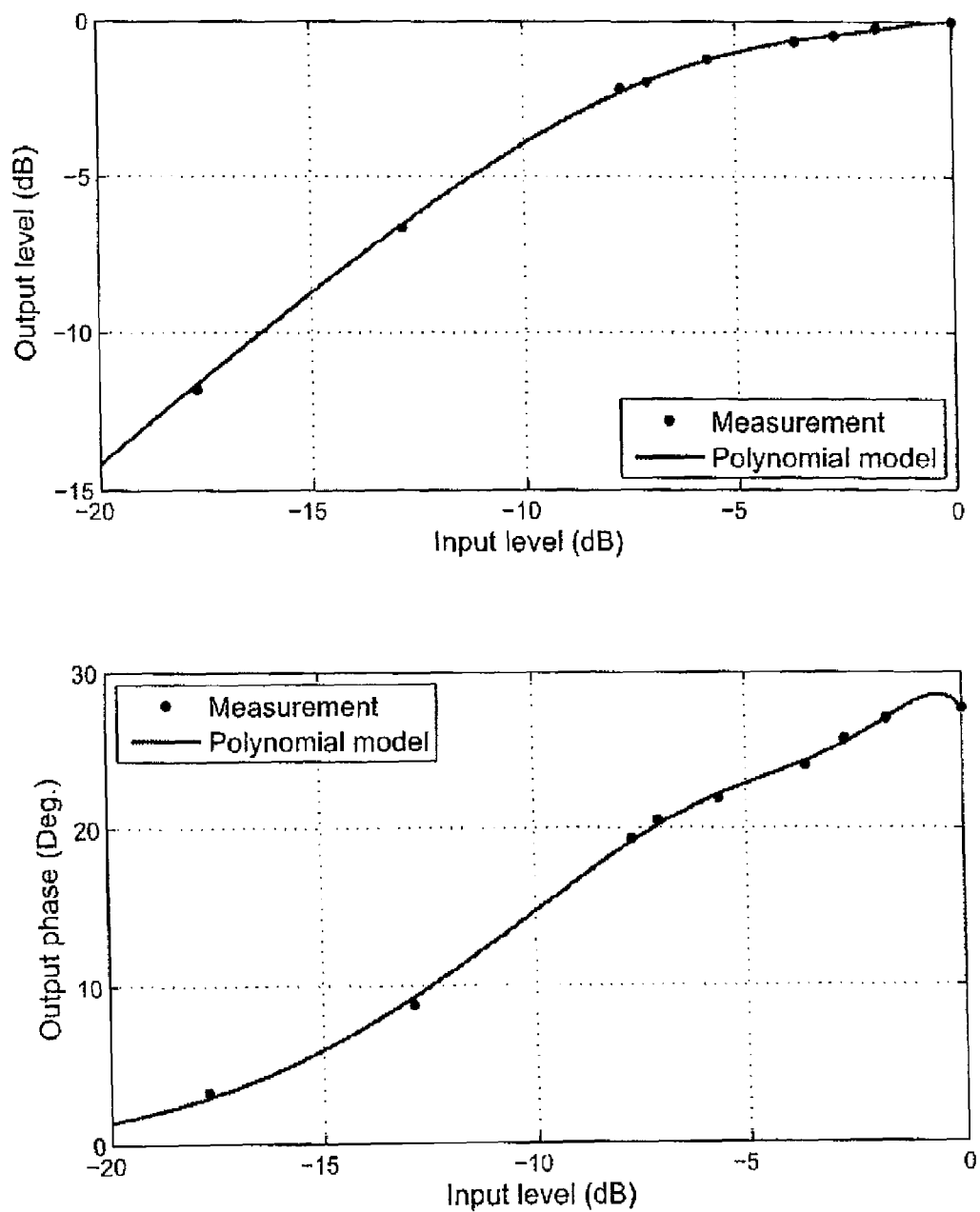
FIG. 7 is a graph showing plots of non-linear output amplitude (top panel) and phase (lower panel) characteristics of a PA#2 (solid state power amplifier)
Figure 8:
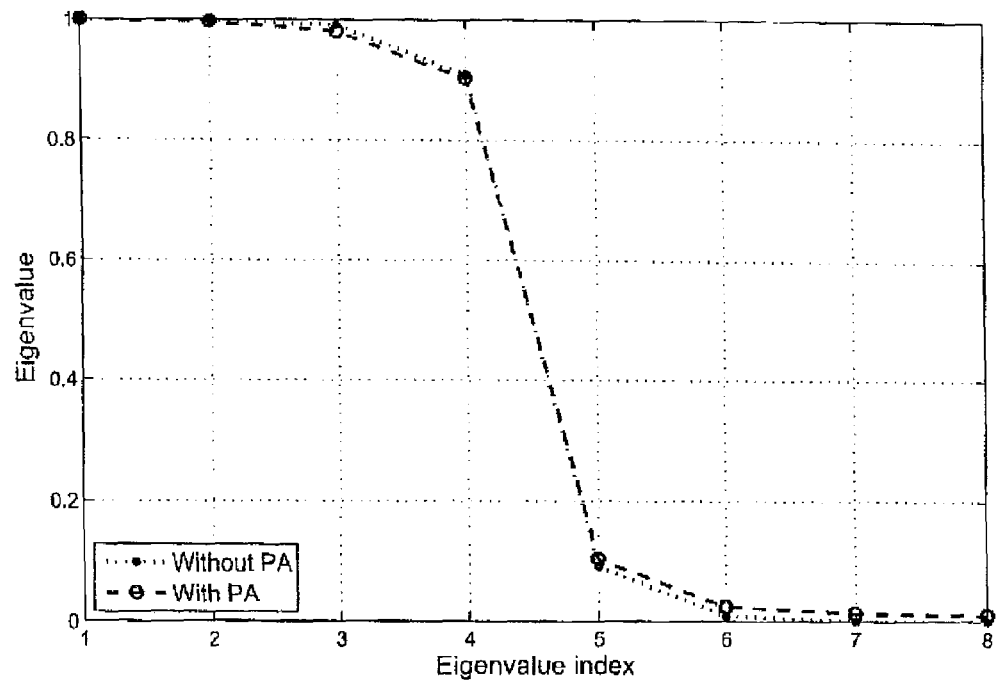
FIG. 8 is a graphical illustration of eigenvalues distribution according to simulations.

Two polynomials of real-valued coefficients are used to implement the pre-distorter: one for the amplitude pre-distortion which has an order of L=8, and the other for the phase pre-distortion which has an order of J=12. The reason that the higher order is chosen for the phase pre-distortion polynomial is because the AM-PM conversion tends to have a larger variation. FIGS. 6 to 8 summarize the PA characteristics, the eigenvalue distributions, and the PA linearization performance.

FIGS. 6 and 7 show the characteristics of the PAs used in the simulations. In the figures, dots represent the measured characteristics, and red-color solid lines represent the characteristics fitted by polynomial models of order 5 used in the simulations to represent the PA transfer functions. Although the amplitude characteristics of these two PAs appear similar, however, their phase characteristics are quite different, and both are accurately described by polynomial functions.

Eigenvalue Distributions

To illustrate the decomposition of the signal space and the distribution of the eigenvalues over the subspaces, an 8×8 correlation matrix is computed from the signal generated according to Table 1. The correlation matrix dimension N=2K=8 is used here, so that the signal subspace and the noise subspace have the same dimension, although any dimension N higher than K, i.e. greater than 4 in this example, can be used. In each case, a measurement sequence of 10,000 symbols is generated, and the resulting signal waveform is used in the correlation matrix calculation. The first PA (TWTA) is used in this example.

Figure 10:
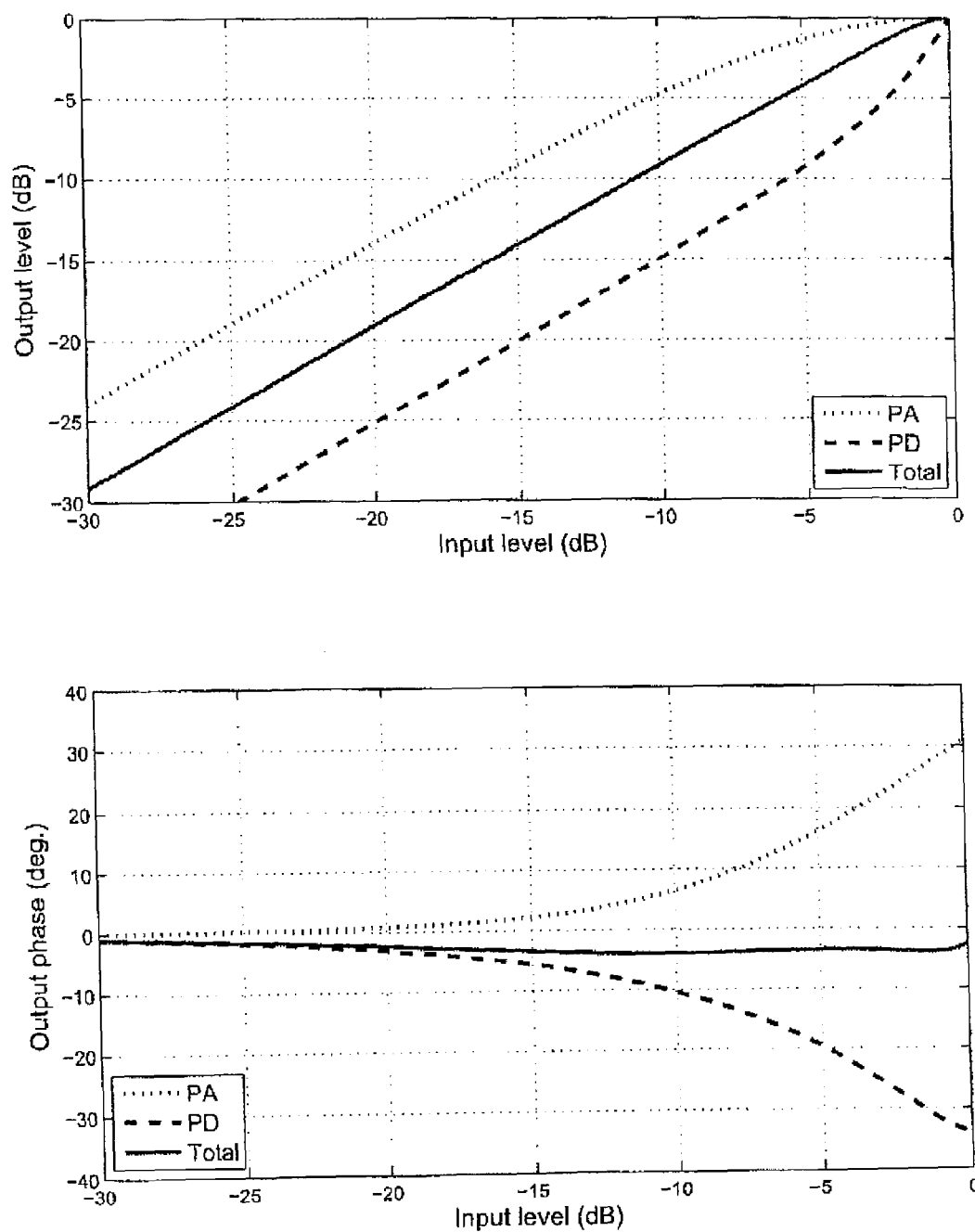
FIG. 10 is a graph showing output characteristics of the PA#1 (dotted curves), corresponding pre-distortion functions generated in simulations by the $1^{st}$ implementation (FIG. 2) of the present invention (dashed curves), and the resulting compensated characteristics (solid curves) for the amplitude (top panel) and phase (lower panel) of the output signal.
Figure 11:
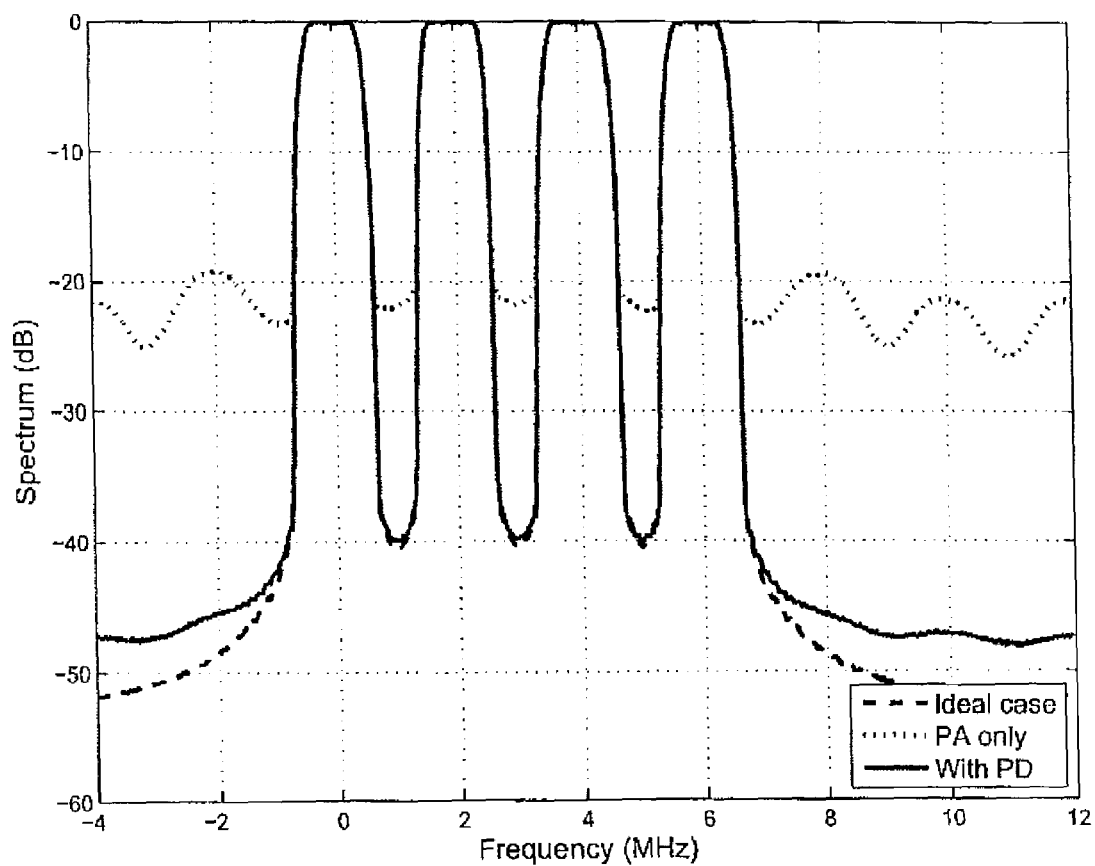
FIG. 11 is a graph showing simulated plots of the output spectrum of the PA#1 with and without the linearization according to $1^{st}$ implementation (FIG. 2) of the present invention.
Figure 13:
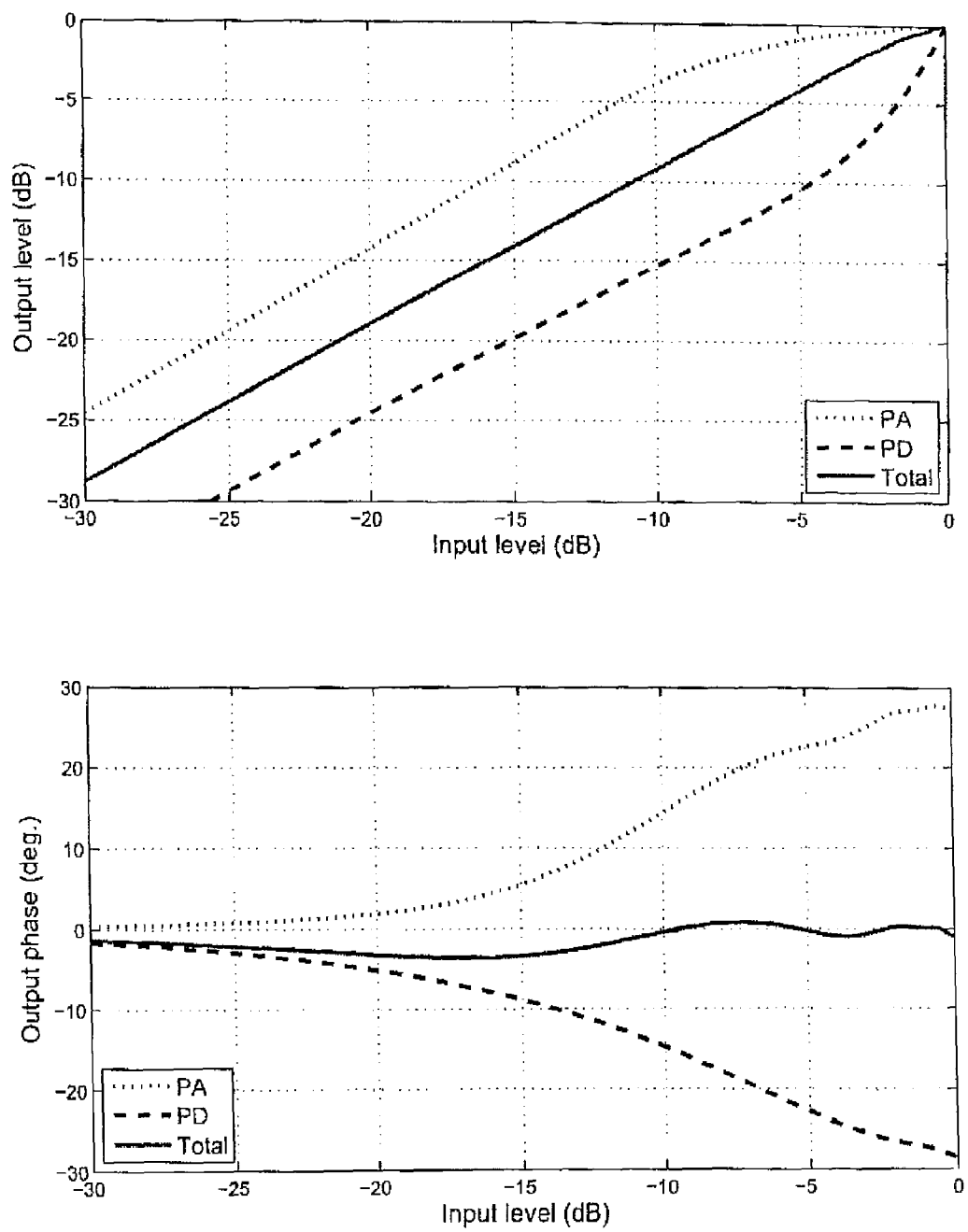
FIG. 13 is a graph showing output characteristics of the PA#2 (dotted curves), corresponding pre-distortion functions generated in simulations by the $1^{st}$ implementation (FIG. 2) of the present invention (dashed curves), and the resulting compensated characteristics (solid curves) for the amplitude (top panel) and phase (lower panel) of the output signal.
Figure 14:
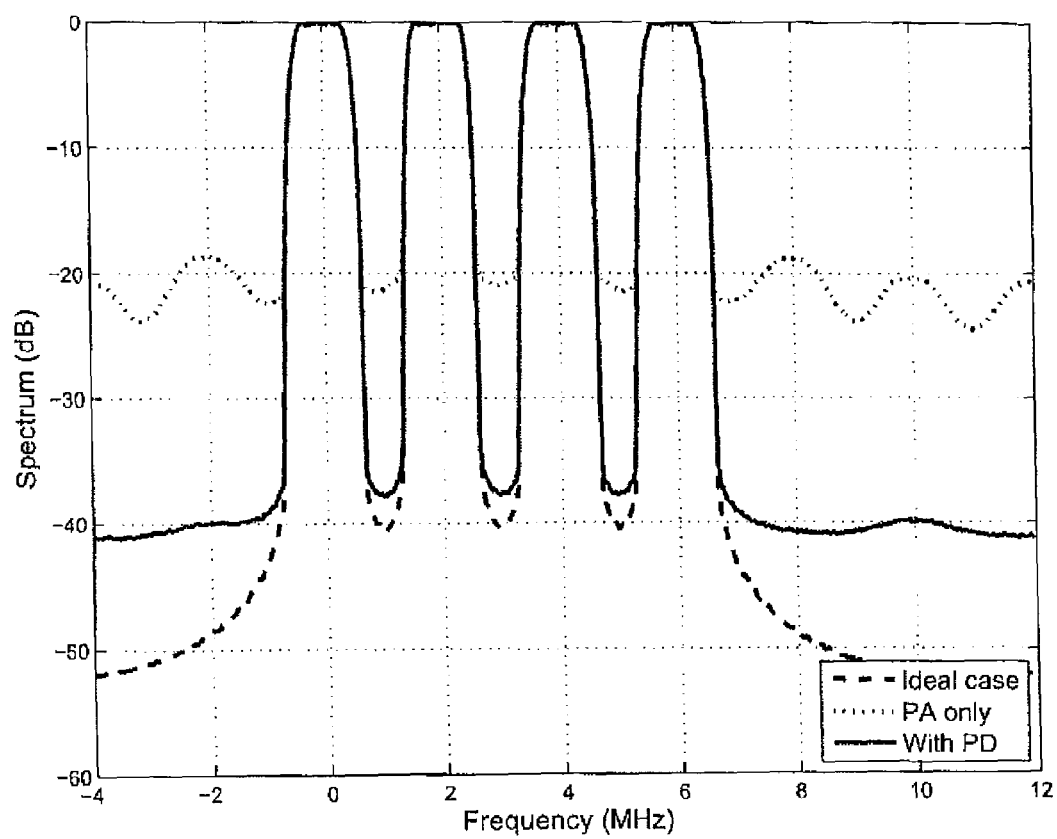
FIG. 14 is a graph showing simulated plots of the output spectrum of the PA#2 with and without the linearization according to $1^{st}$ implementation (FIG. 2) of the present invention.

The eigenvalues calculated from the respective correlation matrix without and with PA are listed in Table 2. The corresponding SDRs are also listed in the Table. All eigenvalues are normalized to the largest one to facilitate comparison. The corresponding distributions of the eigenvalues are also plotted in FIG. 8, with the enlarged portions with more details shown in FIG. 9.

embodiment of FIG. 2, hereinafter referred to as Implementation #1. In FIGS. 10 and 13, the characteristics of the respective PA, the pre-distorter (PD), and the cascaded PD and PA (Total) systems are shown. It is noted that the resulting combined characteristics are essentially linear after the aforedescribed iterative linearization. In FIGS. 11 and 14, the spectra of the output FM signals without and with linearization are shown, together with the spectra of the ideal signal without non-linear distortions. In addition to four modulated carrier signals, the strong spectrum regrowth exists without linearization. With linearization, the spectrum regrowth is significantly reduced.

Figure 12:
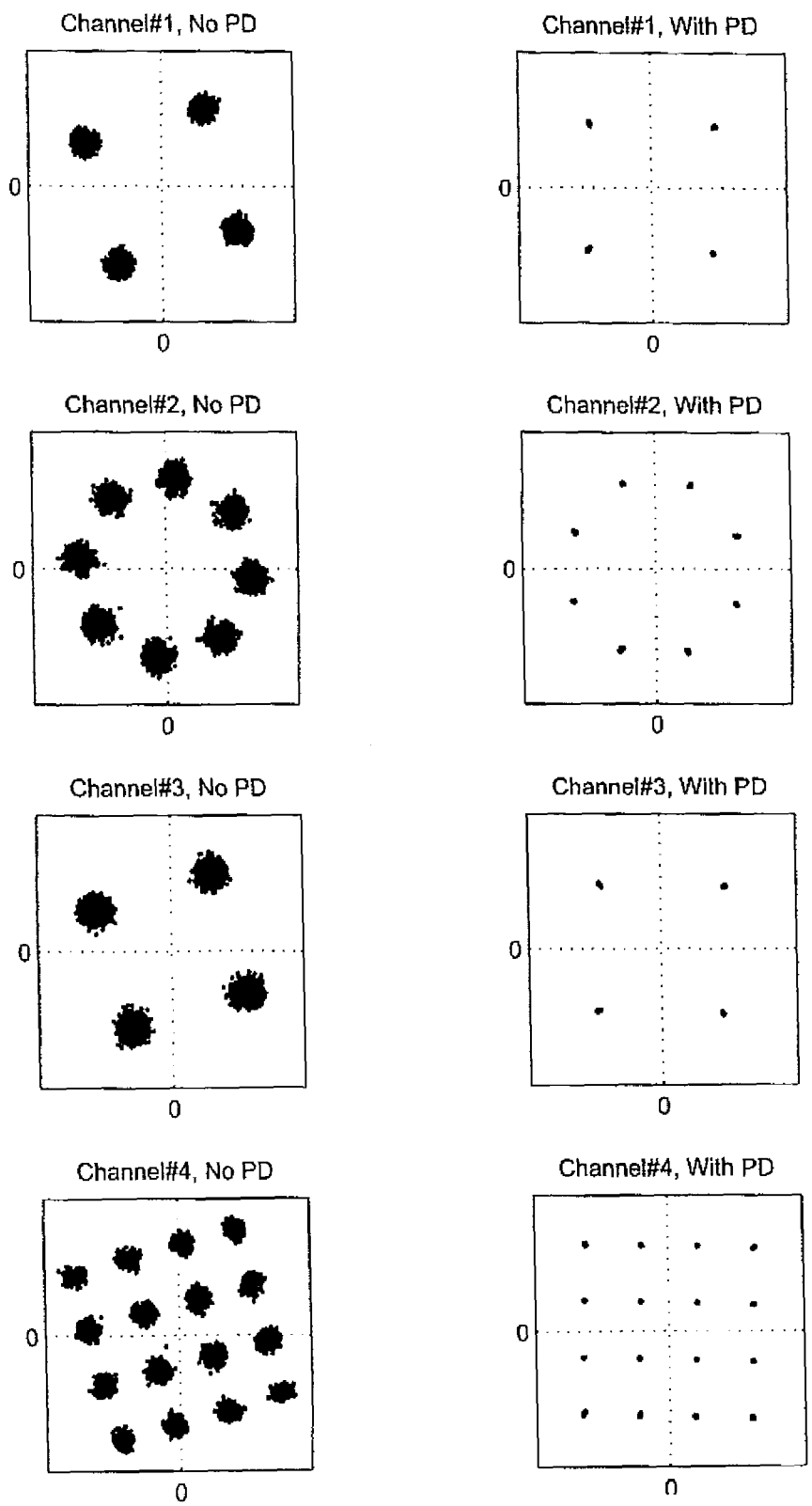
FIG. 12 is a graph showing simulated constellations of the output signal from the PA#1 with and without the linearization according to $1^{st}$ implementation (FIG. 2)
Figure 15:
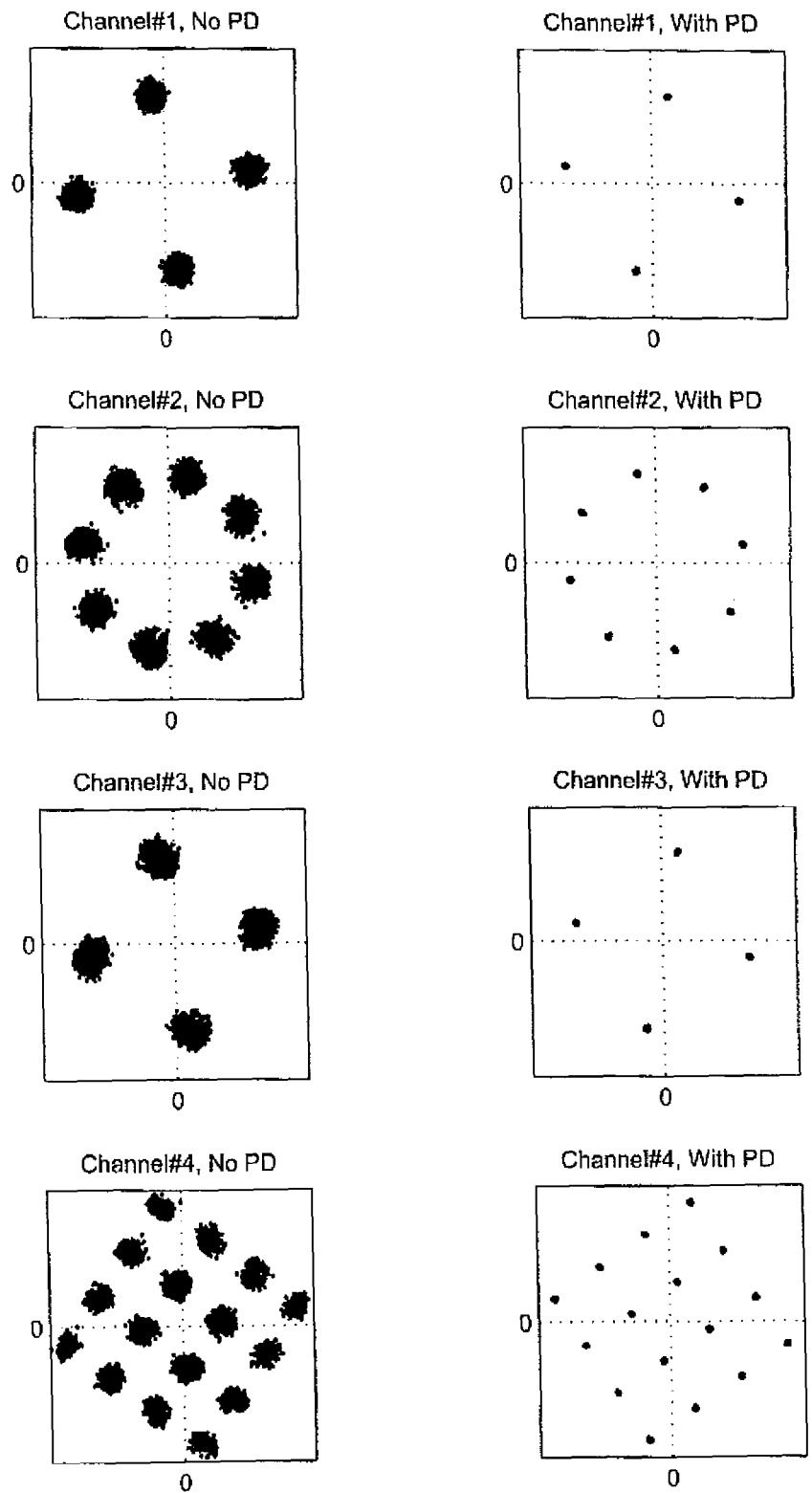
FIG. 15 is a graph showing simulated constellations of the output signal from the PA#2 with and without the linearization according to $1^{st}$ implementation (FIG. 2)
Figure 16:
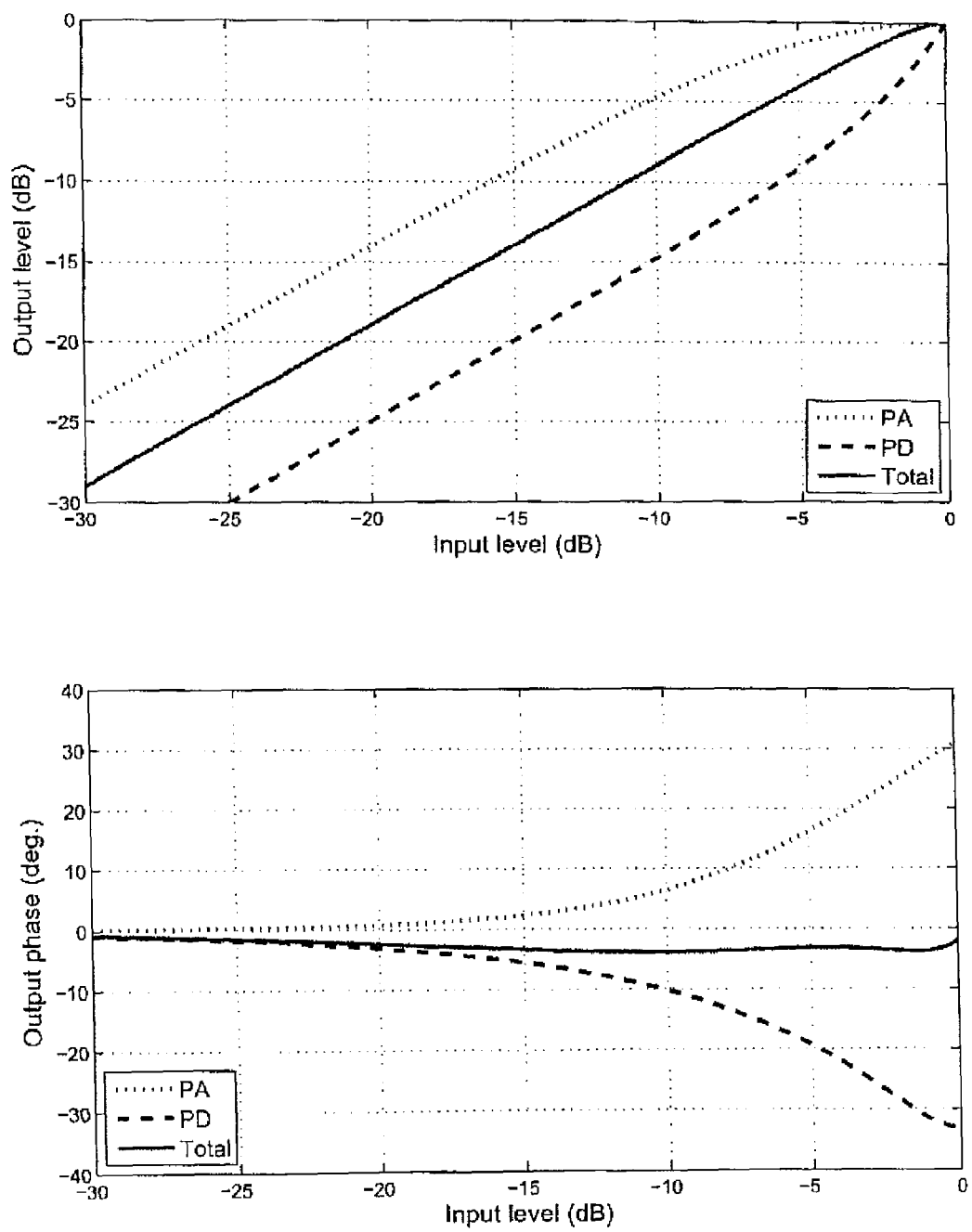
FIG. 16 is a graph showing output characteristics of the PA#1 (dotted curves), corresponding pre-distortion functions generated in simulations by the $2^{nd}$ implementation (FIG. 3) of the present invention (dashed curves), and the resulting compensated characteristics (solid curves) for the amplitude (top panel) and phase (lower panel) of the output signal.
Figure 17:
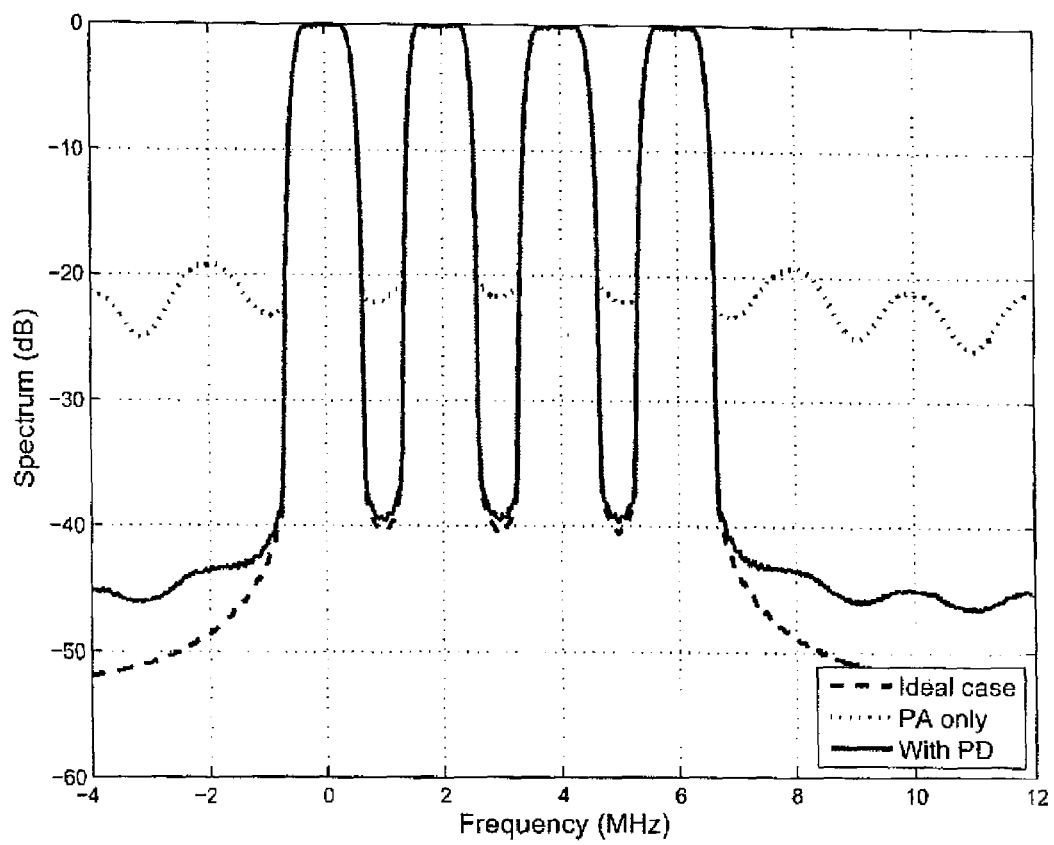
FIG. 17 is a graph showing simulated plots of the output spectrum of the PA#1 with and without the linearization according to $2^{nd}$ implementation (FIG. 3) of the present invention.
Figure 18:
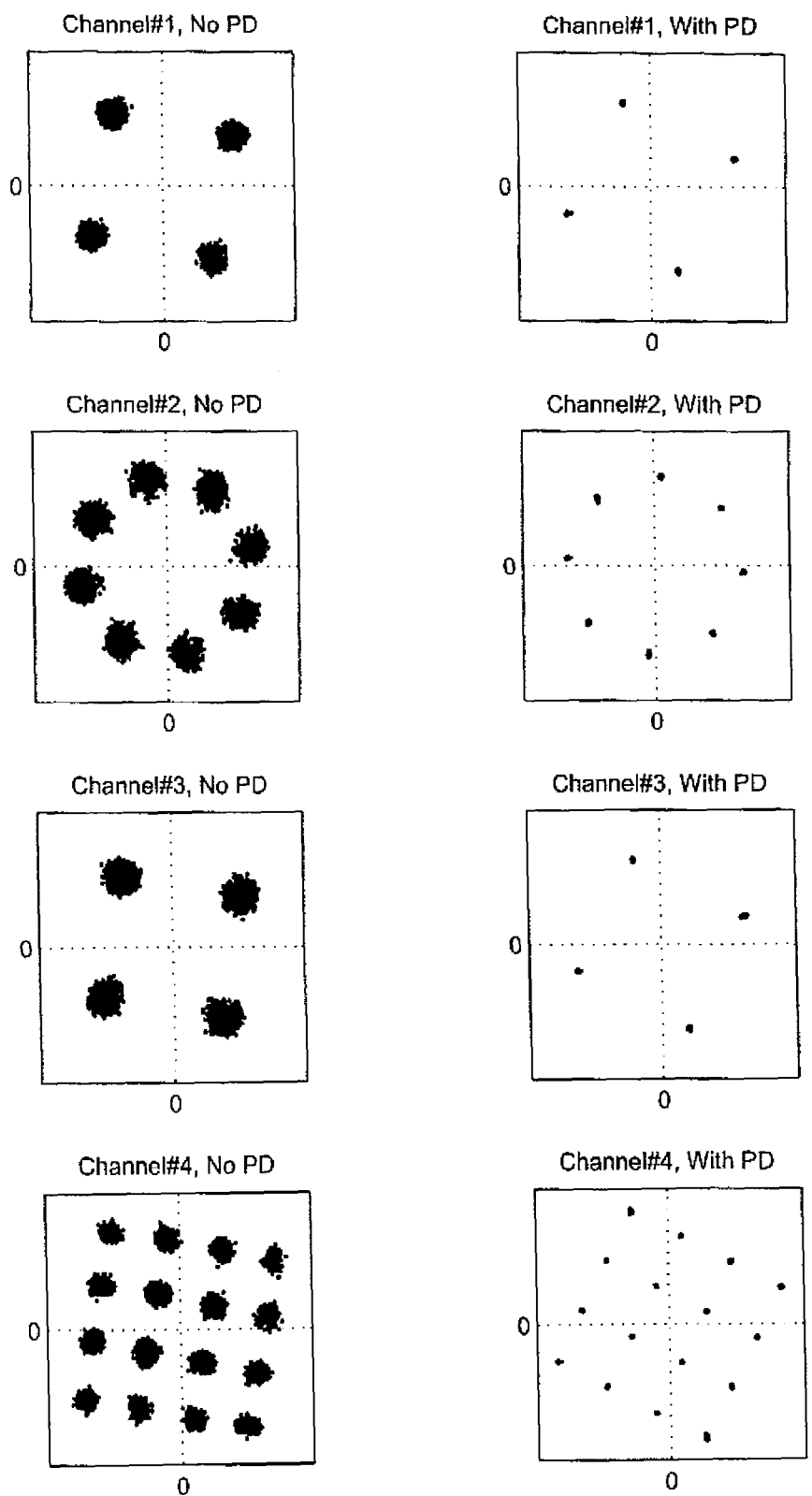
FIG. 18 is a graph showing simulated constellations of the output signal from the PA#1 with and without the linearization according to $2^{nd}$ implementation (FIG. 3)
Figure 19:
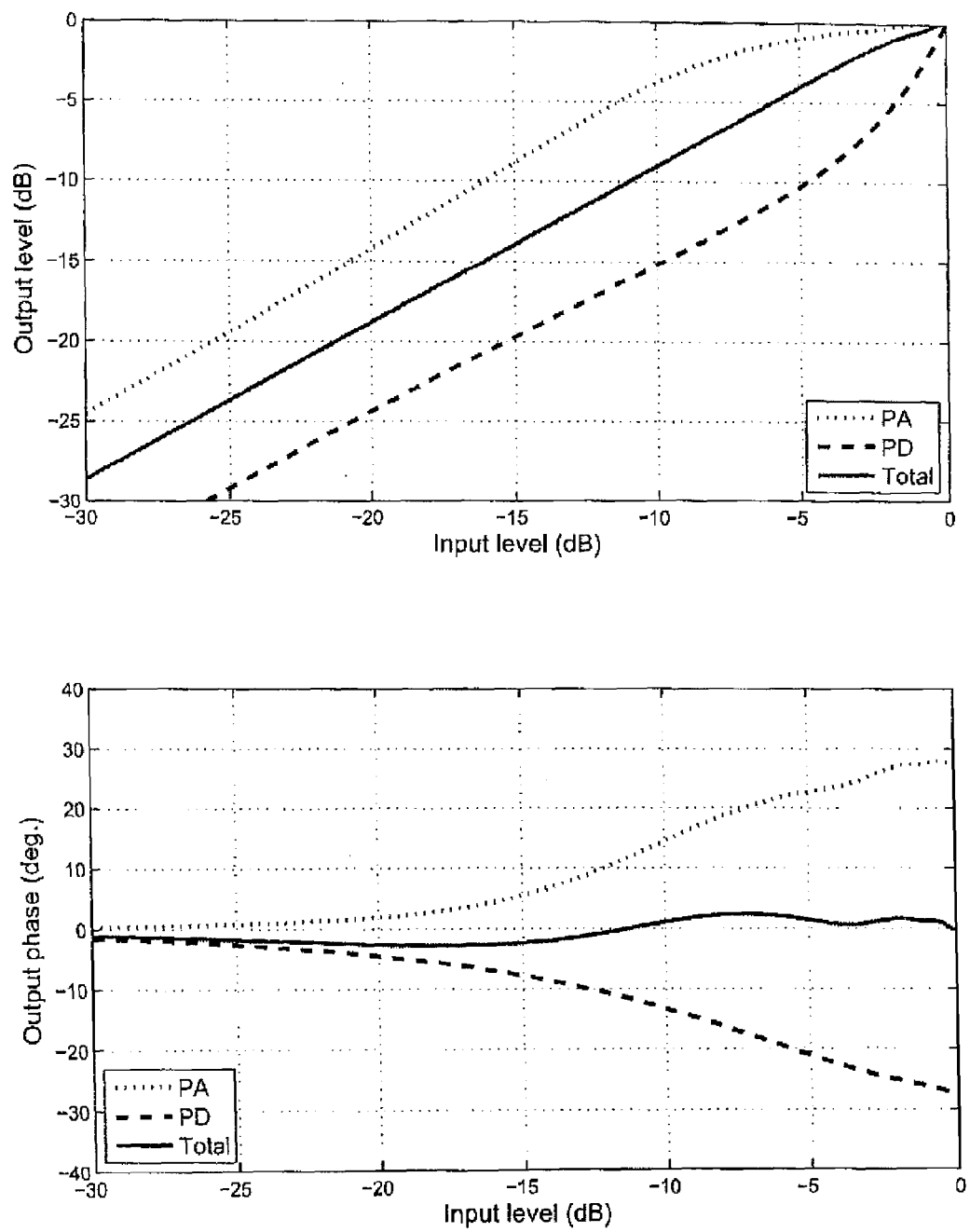
FIG. 19 is a graph showing output characteristics of the PA#1 (dotted curves), corresponding pre-distortion functions generated in simulations by the $1^{st}$ implementation (FIG. 2) of the present invention (dashed curves), and the resulting compensated characteristics (solid curves) for the amplitude (top panel) and phase (lower panel) of the output signal.
Figure 20:
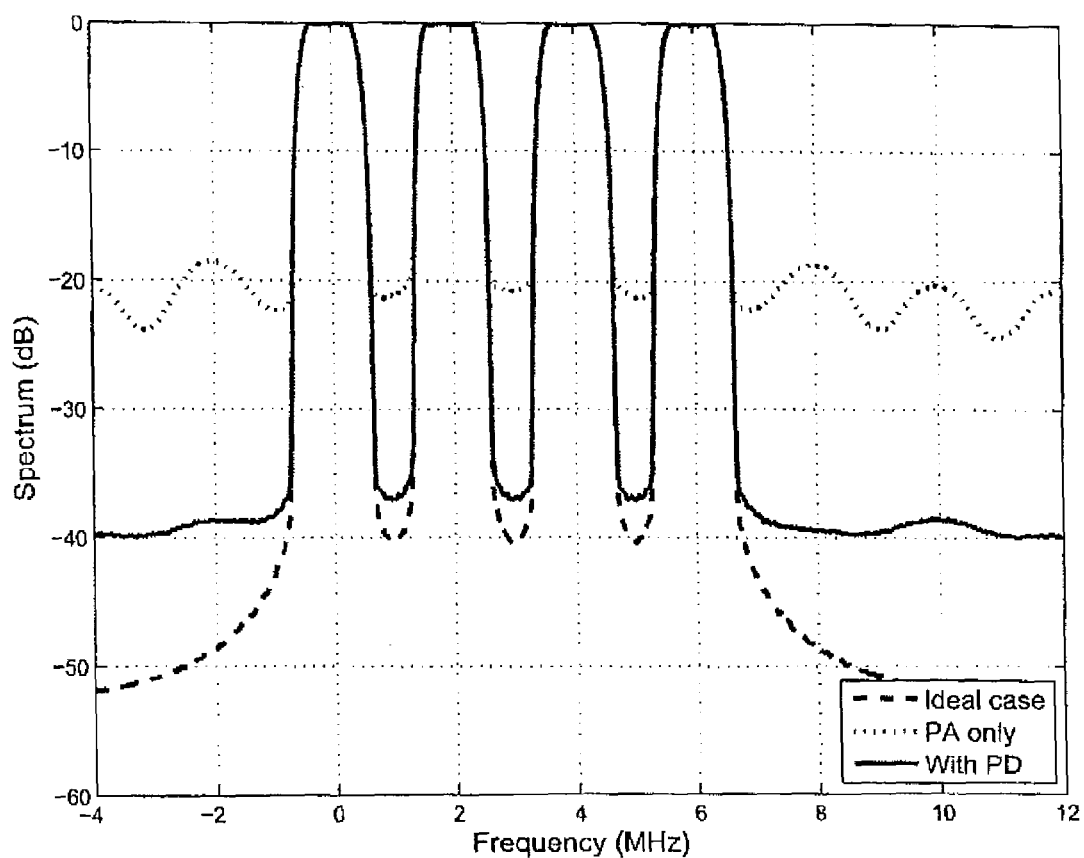
FIG. 20 is a graph showing simulated plots of the output spectrum of the PA#2 with and without the linearization according to $2^{nd}$ implementation (FIG. 3) of the present invention.
Figure 21:
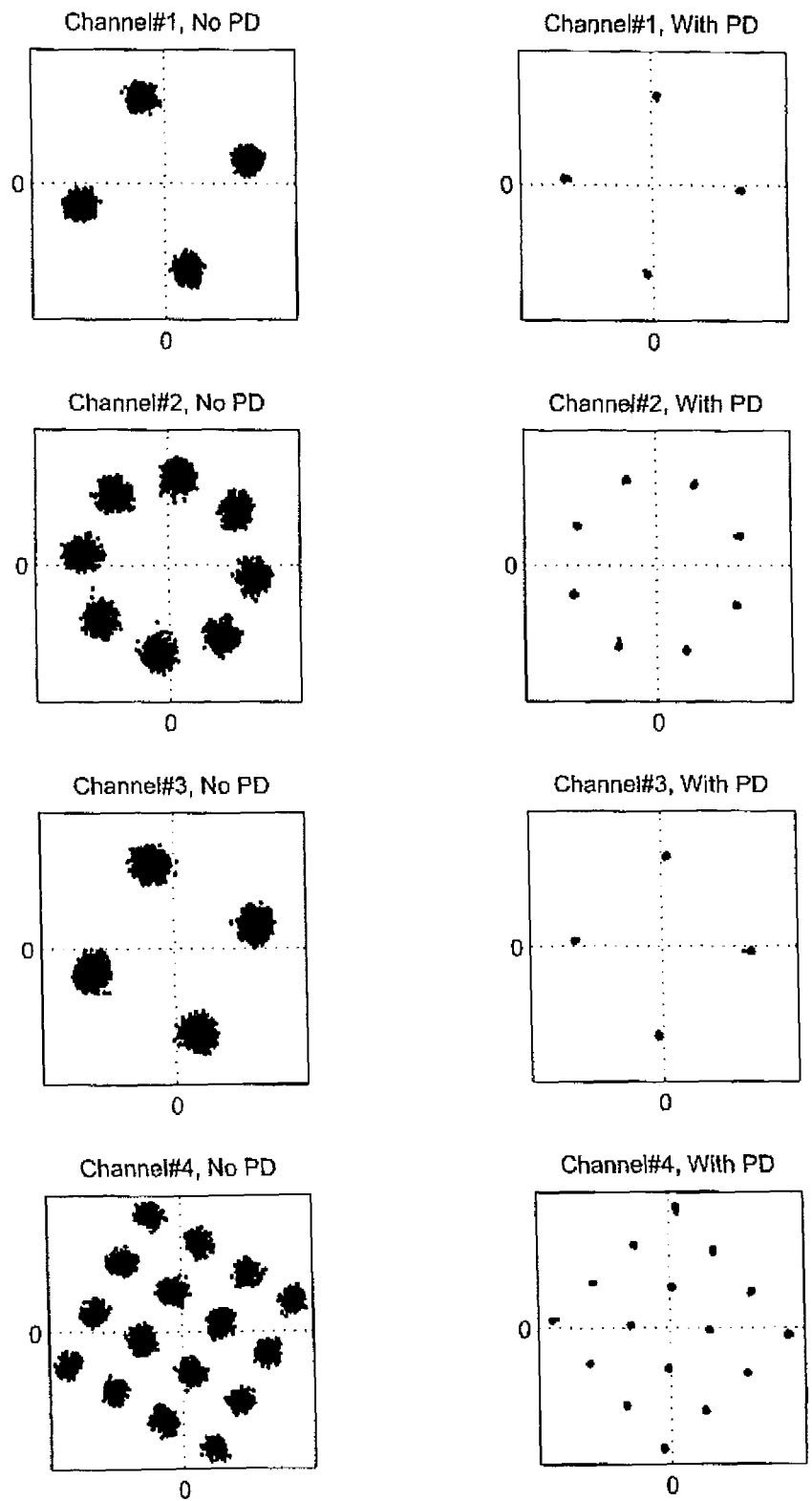
FIG. 21 is a graph showing simulated constellations of the output signal from the PA#2 with and without the linearization according to $2^{nd}$ implementation (FIG. 3)

As the final illustration of the system performance, FIGS. 12 and 15 show constellations of four channels without and with linearization. It can be clearly seen that the PA nonlinearity severely degrades the performance, and that the PA linearization technique yields an accurate pre-distorter function that effectively linearizes the PA and essentially restores the signal constellations.

FIGS. 16 to 18 and 19 to 21 show linearization results of PA1 and PA2 using the simplified embodiment of FIG. 3, hereinafter referred to as Implementation #2. As with the embodiment of FIG. 2, we notice that the significant linearization performance can be achieved by using this simplified implementation, although a slight degradation is visible, compared to the results of the embodiment of FIG. 2.

Summarizing the simulation results, Table 3 lists the spectrum regrowth levels due to the PA nonlinearity and the improvement attributed to the PA linearization using the pre-distorter derived by the proposed estimation technique. It is

TABLE 2

Distribution of eigenvalues in different scenarios.

| | Eigenvalues | | | | | | | | SDR |
|---|---|---|---|---|---|---|---|---|---|
| | Signal eigenvalues | | | | Noise eigenvalues | | | | |
| Without PA | 1.0000 | 0.9983 | 0.9898 | 0.9085 | 0.0908 | 0.0089 | 0.0002 | 0.0000 | 39.00 |
| With PA | 1.0000 | 0.9965 | 0.9797 | 0.9024 | 0.1029 | 0.0240 | 0.0128 | 0.0106 | 25.80 |

Figure 9:
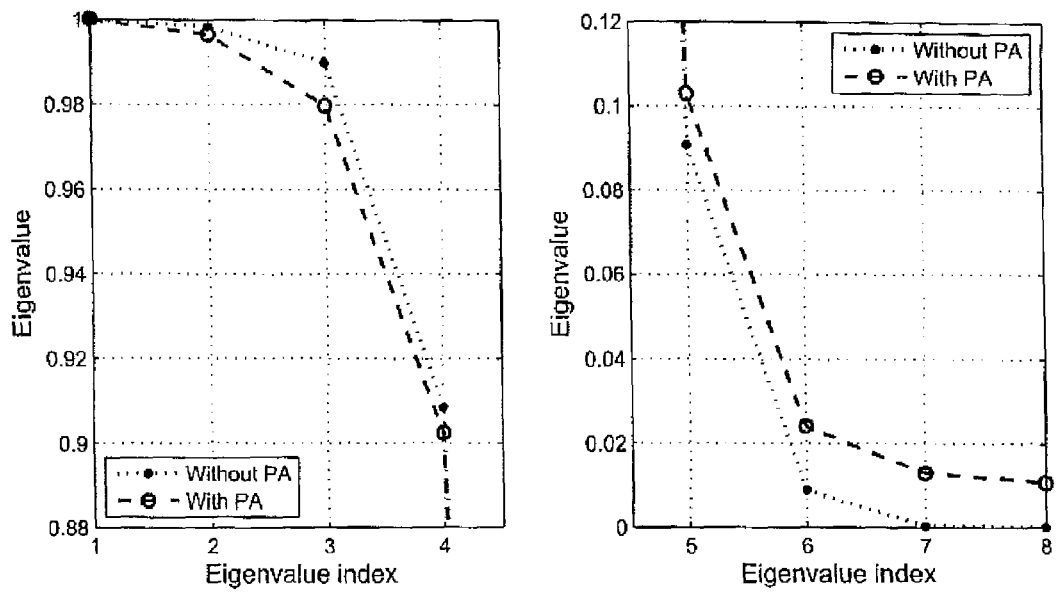
FIG. 9 is a graph showing enlarged portions of the eigenvalues distribution of FIG. 8.

The following observations can be made:

i) A clear distinction exists between the four largest eigenvalues, which are the signal eigenvalues, and the four smallest eigenvalues, which are the noise eigenvalues, given that there are four signals. This distinction helps define and identify the signal subspace and the noise subspace.

ii) When the exact number of carriers is unknown, the distinction between the two groups of eigenvalues can be used to determine the number of carriers.

iii) The existence of the PA nonlinearity causes the reduction in the signal subspace energy and the increase in the noise subspace energy, as illustrated in FIG. 9, thereby increasing the noise eigenvalues significantly, which in turn reduces the SDR, as shown by the SDR values in the last column of Table 2.

iv) In the absence of the PA nonlinearity, not all noise eigenvalues are zero, due to the inaccuracy of the approximation that the signal envelopes remain constant during N=8 consecutive sampling periods. The duration of the 8 sampling periods is one half of a symbol period, during which the signal envelopes actually can change a lot. However, the noise eigenvalues are still very small comparing to the signal eigenvalues, supporting the narrow-band signal approximation and enabling the method to perform well.

FIGS. 10 to 12 and 13 to 15 show linearization results of PA#1 (TWTA) and PA#2 (SSPA), respectively, using the observed that without the linearization, both PAs generate an out of band spectrum regrowth above −20 dB, and that the linearization technique achieves at least a 20 dB improvement in the spectrum regrowth suppression in all cases, with the embodiment of FIG. 2 outperforming that of FIG. 3 slightly.

TABLE 3

Summary of spectrum regrowth suppression performance

| | Without | With PD | |
|---|---|---|---|
| | PD | Implementation #1 | Implementation #2 |
| PA#1 | −19 dB | −45 dB | −44 dB |
| PA#2 | −18 dB | −40 dB | −38 dB |

As an additional system performance measure, the error vector magnitude (EVM) is calculated in each case, and is summarized in Table 4. It is observed that for PA#1, the linearization improves the EVM performance from around 10% down to less than 1%, while for PA#2, it improves the EVM performance from about 10% down to about 1%.

TABLE 4

Summary of EVM performance improvement

| | PA#1 | | | PA#2 | | |
|---|---|---|---|---|---|---|
| Carrier # | Without PD | Implementation #1 | Implementation #2 | Without PD | Implementation #1 | Implementation #2 |
| 1 | 8.97% | 0.51% | 0.61% | 9.67% | 0.91% | 1.08% |
| 2 | 11.07% | 0.47% | 0.63% | 11.92% | 1.02% | 1.20% |
| 3 | 11.09% | 0.52% | 0.67% | 11.66% | 0.90% | 1.08% |
| 4 | 8.71% | 0.58% | 0.96% | 9.73% | 1.14% | 1.24% |

The linearization performance for PA#1 is slightly better than that for PA#2, which has a more complex phase variation than PA#1.

Another observation is that although much simpler in the measurement circuit, Implementation#2 experiences a slight performance degradation under the ideal simulation condition, compared to Implementation#1. This is understandable and expected, since the number of samples used to calculate the correlation matrix in Implementation#2 is effectively one half of the samples used in Implementation#1. On the other hand, Implementation#1 needs to use a vector mixer in the feedback circuit, which in practice experiences some degradation due to its gain/phase imbalances even if a gain/phase imbalance calibration is implemented. Therefore, both implementations may lead to the same linearization performance in practice, with Implementation#2 being more attractive in some applications due to its simplicity.

Experimental Results

The aforedescribed PA linearization technique is used to derive the pre-distortion functions for the multi-carrier PA linearization in an existing 20 GHz 4-carrier experimental setup. Due to the limitation of the reconstruction filter bandwidth in this setup, the symbol rate and the carrier frequency allocation of the four signals are scaled down from those for simulations in Table 1 to the values in Table 5. The frequency allocation is relative to the RF LO frequency of 20 GHz. The sampling frequency is also reduced.

TABLE 5

Signal configurations for the experimental setup

| | Carrier #: | | | |
|---|---|---|---|---|
| | 1 | 2 | 3 | 4 |
| Modulation: | QPSK | 8-PSK | QPSK | 16-QAM |
| Symbol rate: | | 39.0625 KHz | | |
| Roll-off: | 0.25 | 0.25 | 0.35 | 0.35 |
| Carrier frequency | −117.1875 KHz | −39.0625 KHz | 39.0625 KHz | 117.1875 KHz |
| Sampling frequency | | | 5 MHz | |

The four channel signals are generated in computer according to the parameters in Table 5, and are summed together with the proper carrier frequency allocation. The I and Q waveforms of the summed signal are converted to analog via a PCI-based digital-to-analog conversion card. The analog waveforms are low-pass filtered before being fed to a 20 GHz vector modulator. The RF carrier modulated signal from the vector modulator is fed to a 0.25 W SSPA, whose output is down-converted to a low IF of 1 MHz. The IF signal is then digitized by a PCI-based analog-to-digital conversion card at 5 MHz. The digitized signal is decimated by a factor 8 before being used to derive the pre-distortion functions.

Figure 22:
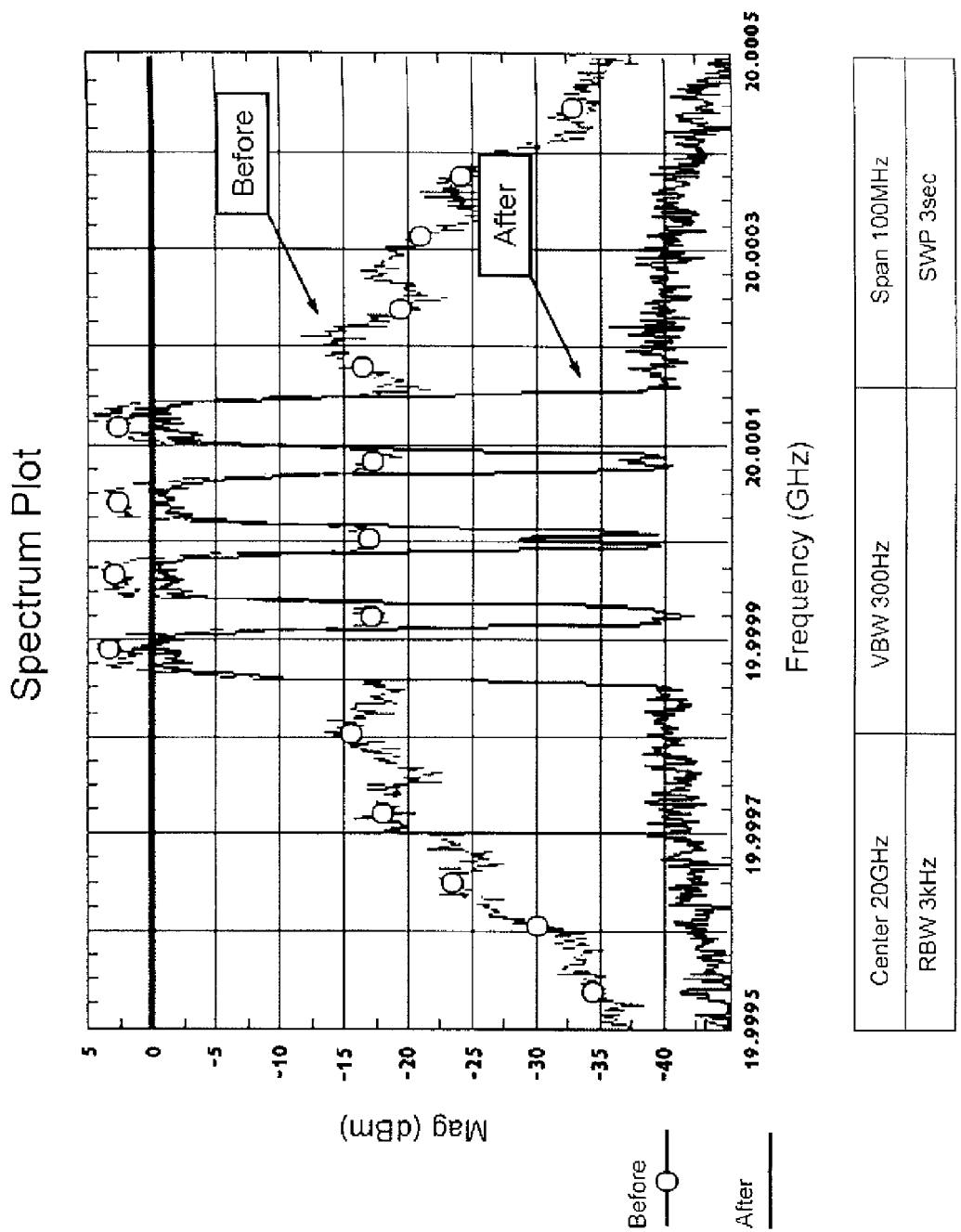
FIG. 22 is a graph showing measured output spectra of a PA with and without the linearization according to $1^{st}$ implementation (FIG. 2) of the present invention.
Figure 23:
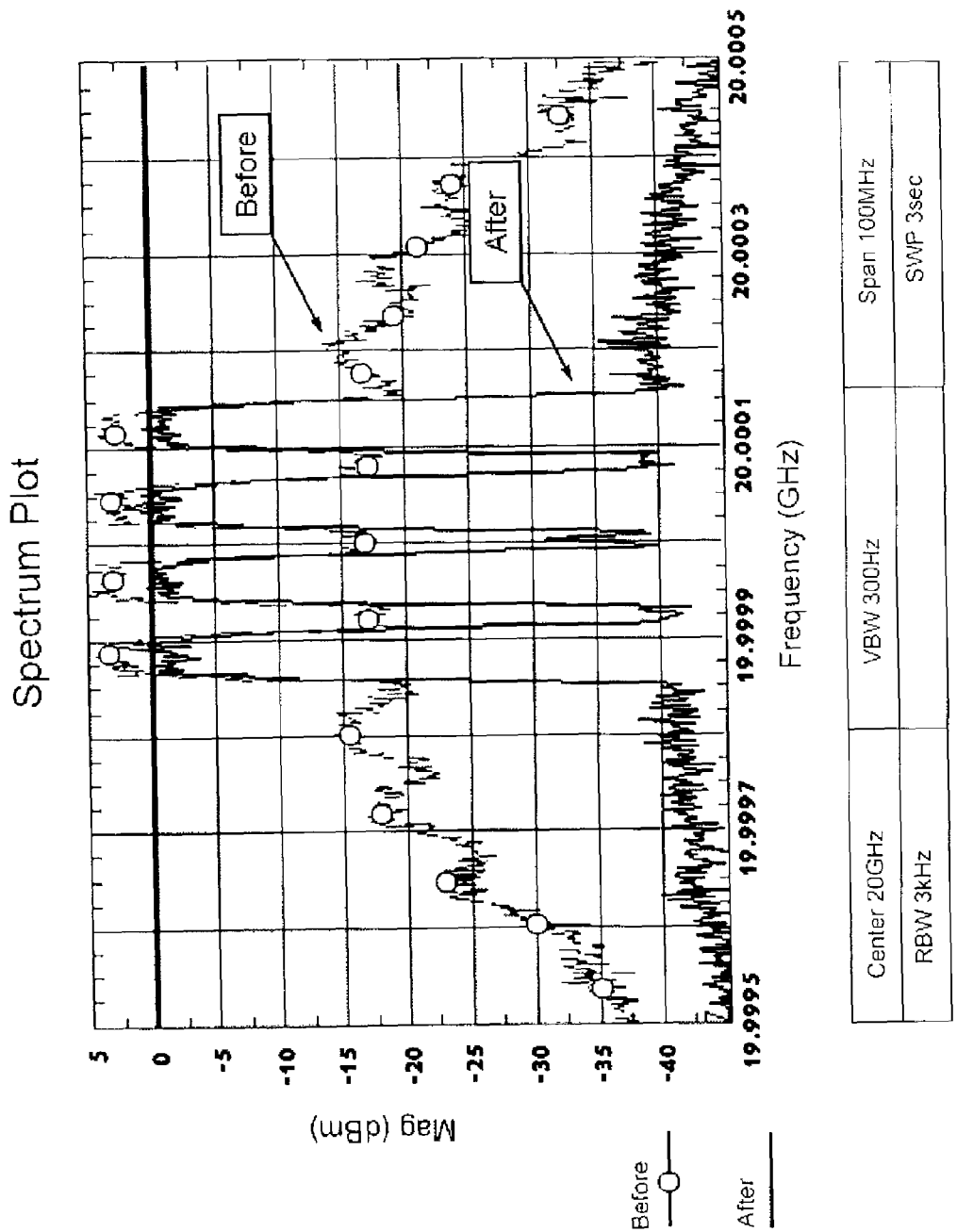
FIG. 23 is a graph showing measured output spectra of a PA with and without the linearization according to $2^{nd}$ implementation (FIG. 3) of the present invention.

The correlation matrix R is estimated from M=8,000 samples. A polynomial of order-8 and a polynomial of order-12 are used to represent the amplitude and phase pre-distortion functions, respectively. Both implementations of FIG. 2 and FIG. 3 are tested in the experiment. The results are shown in FIGS. 22 and 23. It is observed that the new linearization technique yields an accurate pre-distorter that eliminates the effect of the PA nonlinearity and reduces the spectrum regrowth from about −20 dBc down to about −40 dBc. It is also noted that two implementations achieve essentially the same linearization performance.

Advantageously, the aforedescribed method of the present invention for linearizing an amplifier in a multi-carrier transmission system based on a correlation matrix of the output signal can be used during normal operation of the circuit thus allowing it to adapt to changing conditions without service interruptions. In additional advantaged, no advance knowledge of the number K of multiplexed frequency channels is required, which can be estimated in operation within the method itself, albeit knowing the number of channels K in advance does simplify implementations.

It should be noted that various embodiments described herein may utilize features of the other embodiments, and many variations thereof would be apparent to a skilled reader. Of course numerous other embodiments may be envisioned without departing from the scope of the invention. For example, alternative optimization techniques can be used by the controller 88 to determine an optimal pre-distortion function which suitably maximizes or increases the estimated SDR. Furthermore, other methods to compute the eigenvalues of the correlation matrix, or a directly estimate a ratio thereof for the signal and noise sub-spaces, could be used in embodiments of the present invention. Also, the method of the present invention can be carried out at a calibration stage rather than in operation, in which case the tap coupler 45 may be omitted and all output signal 5 directed to the feedback circuit. Furthermore, although specific details of the method and circuit of the present invention have been described hereinabove with reference to a power amplifier of a quadrature multi-carrier transmitter, the present invention is not limited to such but can be used to linearize other types of amplifiers, such as but not limited to mid-stage and input amplifiers, as well as other nonlinear circuits exhibiting undesired nonlinearities in multi-carrier systems.

We claim:

1. A method for compensating for nonlinear distortion of a frequency-multiplexed (FM) signal in an amplifier, the method comprising:
   a) pre-distorting the FM signal prior to passing thereof through the amplifier in accordance with one or more adjustable pre-distortion parameters;
   b) passing the FM signal through the amplifier to obtain an output FM signal;
   c) sampling at least a portion of the output FM signal to obtain a sampled signal comprising a sequence of signal samples;
   d) computing a signal correlation matrix of size N×N for the sampled signal, wherein N is an integer greater than a number of frequency channels in the FM signal;
   e) estimating a signal to distortion ratio (SDR), or a function thereof, based on the signal correlation matrix; and,
   f) iteratively repeating steps a) to e) while varying the one or more adjustable pre-distortion parameters so as to increase the SDR.

2. The method of claim 1, wherein step e) comprises estimating a ratio of eigenvalues of the correlation matrix.

3. The method of claim 1, wherein step e) comprises:
e1) computing eigenvalues of the signal correlation matrix; and,
e2) estimating the SDR based on the eigenvalues.

4. The method of claim 1, wherein step e) comprises
e1) estimating a condition number of the signal correlation matrix; and,
e2) obtaining the SDR from the condition number of the correlation matrix.

5. The method of claim 3, wherein step e1) comprises transforming the correlation matrix to a diagonal form for determining the eigenvalues thereof.

6. The method of claim 3, wherein step e2) comprises sorting the eigenvalues in ascending or descending order, and computing a ratio of one or more largest eigenvalues to one or more smallest eigenvalues.

7. The method of claim 3, wherein step e2) comprises computing the SDR in accordance with a following formula:

$$SDR = \frac{\lambda_1 + \lambda_2 + \ldots + \lambda_K}{\lambda_{K+1} + \lambda_{K+2} + \ldots + \lambda_N}$$

wherein $\lambda_1, \lambda_2, \ldots, \lambda_K$ are K largest eigenvalues of the eigenvalues computed in step e1), and $\lambda_{K+1}, \lambda_{K+2}, \ldots \lambda_N$ are (N−K) smallest eigenvalues of the eigenvalues computed in step e1), wherein K is the number of frequency channels in the FM signal.

8. The method of claim 1, wherein step f) comprises:
f1) saving the SDR, or a value related thereto, in a computer readable memory as a saved objective function value, and further comprises the steps of:
f2) incrementing the one or more adjustable pre-distortion parameters and repeating steps a) to e) to obtain an updated SDR;
f3) comparing the updated SDR, or a value related thereto, with the saved objective function value; and,
f4) incrementing or decrementing the one or more adjustable pre-distortion parameters in dependence upon a result of the comparing in step f3).

9. The method of claim 1, wherein step a) comprises using a polynomial pre-distortion function for pre-distorting the FM signal.

10. The method of claim 1, wherein step a) comprises using a look up table, a rational function, a Volterra series, or a Fourier series as a pre-distortion function for pre-distorting the FM signal.

11. The method of claim 1, wherein the amplifier is a power amplifier.

12. The method of claim 1, wherein step d) comprises computing at least N different auto-correlation coefficients of the sampled signal, and saving the at least N different auto-correlation coefficients in a memory for use as elements of the correlation matrix.

13. The method of claim 12, wherein computing of each of the at least N different auto-correlation coefficients comprises accumulation, for a section of the sampled signal spanning multiple modulation periods of each of the frequency channels, pair-wise products of signal samples having a same inter-sample delay p, wherein p is an integer in a range from 0 to (N−1), and computing an average value thereof.

14. The method of claim 13, wherein each of the at least N different correlation coefficients is recursively computed using successive sections of the sampled signal, each of which comprising N signal samples.

15. The method of claim 1, wherein step c) comprises sampling the output FM signal at a sampling rate that exceeds a total modulation bandwidth thereof by a factor greater than 2.

16. The method of claim 3, further comprising the step of determining the number of frequency channels in the FM signal.

17. The method of claim 16, wherein the step of determining the number of frequency channels in the FM signal comprises determining a number of eigenvalues exceeding a threshold.

18. A circuit comprising:
an amplifier having an input port for receiving an input frequency-multiplexed (FM) signal comprised of K frequency channels, and an output port for outputting an output FM signal, wherein the amplifier introduces non-linear distortions into the input FM signal while forming therefrom the output FM signal;
a pre-distorter coupled to the input port of the nonlinear circuit for pre-distorting the input FM signal in accordance with one or more adjustable pre-distortion parameters prior to passing thereof through the amplifier;
a signal sampler coupled to the output port of the amplifier for sampling at least a portion of the output FM signal for obtaining a sampled output signal;
a controller operatively coupled between the signal sampler and the pre-distortion circuit for receiving the sampled output signal and for iteratively generating the one or more adjustable pre-distortion parameters, the controller further comprising:
a correlation computing module for computing a correlation matrix of size N×N for the sampled output signal, wherein N is an integer greater than K;
an SDR computing module operatively coupled to the correlation computing module for computing a signal distortion ratio (SDR) based on the correlation matrix; and,
a pre-distortion generator operatively coupled to the SDR computing module for generating the one or more pre-distortion parameters in dependence upon the SDR.

19. The circuit of claim 18, wherein the controller further comprises:
an SDR memory coupled to the SDR computing module for storing the SDR; and,
an SDR comparator operatively coupled between the SDR computing module and the pre-distortion generator, and further coupled to the SDR memory for comparing values stored in the SDR memory to a current value of the SDR;
wherein the pre-distortion generator is for generating the one or more pre-distortion parameters in dependence upon an output of the SDR comparator.

* * * * *